United States Patent

Shimoda et al.

Patent Number: 5,294,388
Date of Patent: * Mar. 15, 1994

[54] HEAT CONDUCTIVE COLORED ALUMINUM NITRIDE SINTERED BODY AND METHOD OF PREPARING THE SAME

[75] Inventors: Kouhei Shimoda; Takao Maeda; Kouichi Sogabe; Masaya Miyake, all of Hyogo, Japan

[73] Assignee: Sumitomo Electric Industries, Ltd., Osaka, Japan

[*] Notice: The portion of the term of this patent subsequent to Sep. 15, 2009 has been disclaimed.

[21] Appl. No.: 922,682

[22] Filed: Jul. 29, 1992

Related U.S. Application Data

[62] Division of Ser. No. 686,618, Apr. 17, 1991, abandoned.

Foreign Application Priority Data

Apr. 17, 1990 [JP] Japan .................. 2-101396

[51] Int. Cl.$^5$ .................. F27B 9/04; C04B 35/58
[52] U.S. Cl. .................. 264/65; 501/96; 501/98; 501/153
[58] Field of Search .................. 501/96, 98, 92, 99, 501/100, 153; 264/29.1, 29.6, 29.7, 63, 65, 66

[56] References Cited

U.S. PATENT DOCUMENTS

| | | | |
|---|---|---|---|
| 4,435,513 | 3/1984 | Komeya et al. | 501/96 |
| 4,478,785 | 10/1984 | Huseby et al. | 264/65 |
| 4,533,645 | 8/1985 | Huseby et al. | 501/96 |
| 4,578,365 | 3/1986 | Huseby et al. | 501/98 |
| 4,877,760 | 10/1989 | Okuno et al. | 501/98 |
| 5,034,357 | 7/1991 | Yamakawa et al. | 501/96 |
| 5,085,923 | 2/1992 | Yamakawa et al. | 428/209 |
| 5,147,832 | 9/1992 | Shimoda et al. | 501/96 |

Primary Examiner—Mark L. Bell
Assistant Examiner—Michael A. Marcheschi
Attorney, Agent, or Firm—W. G. Fasse; D. H. Kane, Jr.

[57] ABSTRACT

A heat conductive aluminum nitride sintered body contains 100 parts by weight of aluminum nitride, at least 0.005 parts by weight and not more than 0.5 parts by weight of carbon, at least 0.01 parts by weight and not more than 15 parts by weight of a rare earth aluminum oxide in terms of the simple substance of a rare earth element, and at least 0.01 parts by weight and not more than 15 parts by weight of at least one element selected from a group of compounds containing elements belonging to the groups IVB, VB and VIB of the periodic table in terms of the simple substance of the element. Heat conductivity of the aluminum nitride sintered body is at least 100 W/m·K and not more than 270 W/m·K at the ordinary temperature. According to a method of preparing such an aluminum nitride sintered body, at least 0.01 parts by weight and not more than 5 parts by weight of carbon, at least 0.01 parts by weight and not more than 15 parts by weight of an oxide of a rare earth element, and at least 0.01 parts by weight and not more than 15 parts by weight of an oxide, a carbide or a nitride of an element belonging to the group IVB, VB or VIB of the periodic table are added to 100 parts by weight of aluminum nitride. A compact of this mixture is fired in a nonoxidizing atmosphere under a temperature of at least 1500° C. and not more than 2100° C.

1 Claim, No Drawings

HEAT CONDUCTIVE COLORED ALUMINUM NITRIDE SINTERED BODY AND METHOD OF PREPARING THE SAME

CROSS-REFERENCE TO RELATED APPLICATIONS

This is a divisional of U.S. patent application Ser. No. 07/686,618 filed: Apr. 17, 1991 now abandoned.

BACKGROUND OF THE INVENTION

1. Field of the Invention

The present invention relates to a ceramic sintered body which is employed for an electronic material such as an IC substrate material, a package material or the like, and more particularly, it relates to a colored aluminum nitride sintered body having high heat conductivity and a method of preparing the same.

2. Description of the Background Art

In recent years, the technique relating to a large-scale integrated circuit device (LSI) has made a marked advance with remarkable improvement in degree of integration. Following such improvement in degree of integration and increase in size of an IC chip, the heating value of a package carrying such an IC chip has also been improved. Accordingly, a heat radiation property of a substrate material employed for a package for a semiconductor device etc. has been regarded as important. The heat conductivity of an alumina sintered body, which has generally been widely applied to an IC substrate, is rather insufficient as to the heat radiation property. Thus, it is difficult for the alumina sintered body to cope with the increased heating value of the IC chip. To this end, study has been made in order to substitute beryllia, having high heat conductivity, for such an alumina sintered body. However, beryllia is hard to handle because of its toxicity.

On the other hand, a sintered body of aluminum nitride (AlN), which originally has high heat conductivity and high insulability with no toxicity, is watched with interest as a material for a circuit substrate or a package for a semiconductor device.

In general, an impurity content of such an AlN sintered body is so reduced as to obtain an AlN sintered body which is an excellent in heat conductivity and electrical insulability. Such a sintered body is also excellent in translucence, and hence the same is preferably applied to an optical filter etc. in practice. However, it is problematic to apply the AlN sintered body to a package etc. since transmission of ultraviolet rays leads to a malfunction of the IC.

To this end, various researches have been made as to colored AlN sintered bodies, and several successful examples have been reported.

For example, Japanese Patent Laying-Open No. 63-233079 discloses a black aluminum nitride sintered body and a method of preparing the same. According to this literature, a black AlN sintered body can be obtained by adding a specific amount of calcium tungstate powder and/or calcium molybdate powder to AlN powder, mixing and molding the same, and thereafter firing the mixture in a non-oxidizing atmosphere.

On the other hand, Japanese Patent laying-Open No. 63-310772 describes that a black AlN sintered body can be obtained by sintering AlN powder with metal molybdenum or a molybdenum compound, serving as an additive. However, the aluminum nitride sintered bodies disclosed in the aforementioned two gazettes have a low heat conductivity values of about 100 W/m·K.

AlN is apt to incorporates an impurity such as oxygen. Thus, AlN powder of high purity is generally employed in order to improve heat conductivity. If the aforementioned substance is added for coloring, therefore, heat conductivity may be reduced. Thus, it has been impossible to obtain a colored AlN sintered body having high heat conductivity.

However, a substrate material for carrying an IC chip having a high output must have a high heat conductivity, so that its heat radiation property is improved in order to prevent the IC from a malfunction caused by temperature rise of the IC chip. At the same time, the substrate must be colored in order to prevent the IC from a malfunction caused by transmission of ultraviolet rays. According to the conventional technique, however, it has been difficult to provide a ceramic substrate, which can simultaneously satisfy the two requirements for the substrate material for an IC chip, as hereinabove described.

SUMMARY OF THE INVENTION

An object of the present invention is to provide a colored aluminum nitride sintered body having excellent heat conductivity, which is useful as an electronic material such as an IC package material or a substrate material, and a method of preparing the same.

In consideration of the aforementioned circumstances, the inventors have made deep study as to an AlN sintered body having reciprocal characteristics of high heat conductivity and a coloring property, and found the following two points:

(a) Presence of carbon in the sintered body is effective for coloring of the sintered body.

(b) When the sintered body contains a rare earth aluminum oxide, which is a composite oxide of a rare earth oxide and an aluminum oxide, and a compound of an element belonging to the group IVB, VB or VIB of the periodic table in prescribed amounts with a specific amount of carbon, the sintered body is colored with high heat conductivity of at least 100 W/m·K and not more than 270 W/m·K at the ordinary temperature.

In a specific composition, the inventive aluminum nitride sintered body contains 100 parts by weight of AlN, at least 0.005 parts by weight and not more than 0.5 parts by weight of carbon, at least 0.01 parts by weight and not more than 15 parts by weight of a rare earth aluminum oxide in terms of the simple substance of a rare earth element, and at least 0.01 parts by weight and not more than 15 parts by weight of at least one element selected from a group of compounds containing elements belonging to the groups IVB, VB and VIB of the periodic table in terms of the simple substance of the element. The elements belonging to the group IVB of the periodic table are Ti, Zr and Hf, and those belonging to the group VB are V, Nb and Ta, while those belonging to the group VIB are Cr, Mo and W.

The rare earth elements are Sc, Y, La, Ce, Pr, Nd, Sm, Eu, Gd, Tb, Dy, Ho, Er, Yb and Lu. The rare earth aluminum oxide is formed by chemical reaction between an additional rare earth element oxide and aluminum oxide which is present in AlN as an impurity, to be contained in the sintered body. Although the effect of its existence is not varied with the type of the rare earth element, it is preferable to add any one of Sc, Y, La and Ce in order to obtain a sintered body which is excellent in reliability in relation to chemical resistance etc.

The carbon content in the aluminum nitride sintered body is restricted in a range of at least 0.005 parts by weight and not more than 0.5 parts by weight with respect to 100 parts by weight of aluminum nitride. If the carbon content is less than the lower limit of this range, it is impossible to obtain a sintered body having high heat conductivity. If the carbon content exceeds the upper limit of the aforementioned range, on the other hand, the carbon deoxidizes a liquid phase of the rare earth aluminum oxide in firing and blocks mass transfer through such a liquid phase. Thus, it is impossible to obtain a dense sintered body.

In a method of preparing a heat conductive colored aluminum nitride sintered body according to one aspect of the present invention, at least 0.01 parts by weight and not more than 5 parts by weight of carbon, at least 0.01 parts by weight and not more than 15 parts by weight of a rare earth element oxide in terms of the simple substance of the rare earth element, and at least 0.01 parts by weight and not more than 15 parts by weight of at least one element selected from a group of oxides, carbides and nitrides of elements belonging to the groups IVB, VB and VIB of the periodic table in terms of the simple substance of the element are added to 100 parts by weight of aluminum nitride, to obtain a mixture. This mixture is shaped into a prescribed configuration, to obtain a compact. This compact is fired in a non-oxidizing atmosphere under a temperature of at least 1500° C. and not more than 2100° C.

The additional amount of carbon is synthetically determined in consideration of the type of the additional carbon, the oxygen content in the AlN raw material powder, firing conditions, and the like. At least 0.01 parts by weight and not more than 5 parts by weight of carbon is added to 100 parts by weight of aluminum nitride, for reasons similar to the above. The lower limit of the additional amount of carbon is set at 0.01 parts by weight, so that the finally obtained aluminum nitride sintered body contains at least 0.005 parts by weight of carbon.

The carbon material herein employed may be prepared from carbon black, coke, graphite powder, diamond powder or the like. It is preferable to restrict the particle diameter, the specific surface area, the pH value, volatile components etc. of such carbon material to specific values, in order to attain homogeneous dispersion in an unsintered body of aluminum nitride. In particular, it is effective to use fine powder of carbon black having a BET value of at least 200 m$^2$/g. The term "BET value" indicates one value of a specific surface area measured by an absorption process.

The compact is fired under a temperature of at least 1500° C. since the sintered body is ineconomically densified at a slow speed if the compact is fired at a temperature lower than 1500° C. If the firing temperature exceeds 2100° C., on the other hand, it is difficult to obtain a dense sintered body since aluminum nitride is significantly decomposed and evaporated. The rare earth 10 aluminum oxide is formed by reaction between the rare earth element oxide and the aluminum oxide. Grain growth of AlN progresses by mass transfer through a liquid phase of the rare earth aluminum oxide. Therefore, if the temperature for forming such a liquid phase, i.e., the melting point of the rare earth aluminum oxide is in excess of 2100° C., it is difficult to obtain a dense sintered body due to decomposition and evaporation of AlN.

Heat conductivity of the colored aluminum nitride sintered body is improved by such addition of carbon, conceivably in the following mechanism: When a compound of the element belonging to the group IVB, VB or VIB of the periodic table is added to the unsintered body and fired in accordance with the conventional method, the liquid phase of the rare earth aluminum oxide is inferior in wettability with respect to aluminum nitride particles. The compound of the element belonging to the group IVB, VB or VIB of the periodic table, which is inferior in wettability with respect to the AlN particles, is present in a grain boundary portion of the sintered body, to contribute to coloring of the sintered body. At the same time, part of the compound solidly dissolves in the AlN particles with oxygen. When the element compound solidly dissolves in the AlN particles with oxygen and the AlN particles are inferior in wettability with respect to the liquid phase of the rare earth aluminum oxide, it is difficult to trap oxygen from the AlN particles to the liquid phase of the rare earth aluminum oxide. It is known that oxygen untrapped by the liquid phase solidly dissolves in particles of the AlN sintered body, to form an oxynitride of $Al(Al_{(8/3+x/3)}O_{4-x}N_x)$, spinel ($Al_9O_3N_7$), $\alpha$-$Al_2O_3$ etc., and significantly reduces heat conductivity of the sintered body, regardless of its denseness.

On the other hand, the inventors have clarified that carbon added to the raw material deoxidizes oxygen, which solidly dissolves in the AlN particles simultaneously with part of the compound of the element belonging to the group IVB, VB or VIB of the periodic table solidly dissolving in the AlN particles, and eliminates the same from the system. It is amazing that wettability of the liquid phase is not damaged with respect to the AlN particles, in which the compound of the element belonging to the group IVB, VB or VIB of the periodic table solidly dissolves, but oxygen is sufficiently trapped from the AlN particles. Thus, it is possible to obtain a sintered body having high heat conductivity. At the same time, the carbon contained in the sintered body scatters visible rays which are transmitted through the sintered body, to effectively color the sintered body. It is conceivable that a colored sintered body having high heat conductivity can be obtained since the effect of such coloring is not lost by addition of the compound of the element belonging to the group IVB, VB or VIB of the periodic table.

As to the compound of the element belonging to the group IVB, VB or VIB of the periodic table, a compound forming the aforementioned compound upon firing, such as an inorganic compound such as a nitrate or an oxalate of an element belonging to the group IVB, VB or VIB of the periodic table, or an organometallic compound such as an alkoxide may be employed in place of an oxide, a carbide or a nitride, to attain a similar effect. The effect of coloring is improved as the particle diameter of such a compound is reduced, preferably to about 0.05 to 1 μm, in particular. The upper limit of the particle diameter of the compound is about 20 times that of the AlN powder as used.

In a method of preparing a heat conductive colored aluminum nitride sintered body according to another aspect of the present invention, at least 0.01 parts by weight and not more than 5 parts by weight of a compound liberating carbon in terms of the amount of free carbon, at least 0.01 parts by weight and not more than 15 parts by weight of a rare earth element oxide in terms of the simple substance of the rare earth element, and at least 0.01 parts by weight and not more 15 parts by weight of at least one element selected from a group of oxides, carbides and nitrides of elements belonging to the groups IVB, VB and VIB of the periodic table in terms of the simple substance of the element are added to 100 parts by weight of aluminum nitride, to obtain a mixture. This mixture is shaped into a prescribed configuration, to obtain a compact. This compact is heated in a nonoxidizing atmosphere under a temperature of at least 150° C. and not more than 1500° C., to liberate carbon. Thereafter the compact is fired in a non-oxidizing atmosphere under a temperature of at least 1500° C. and not more than 2100° C.

The compound liberating carbon may be prepared from an organic compound such as a fatty acid compound or an aromatic compound, or a high molecular compound such as styrene resin, acrylic resin, phenol resin or urethane resin. According to the present invention, it is preferable to use one of polyacrylonitrile, polyvinyl alcohol, polyvinyl butyral, polyethylene terephthalate, glucose, fructose and sucrose, or a mixture thereof.

The feature of the method according to the second aspect of the present invention resides in that the compound liberating carbon is contained in the unsintered body, while carbon is contained in the unsintered body in the aforementioned method according to the first aspect of the present invention. According to this method, it is possible to homogeneously distribute carbon in the asformed sintered body and to reduce nonuniformity of the composition, the color tone etc. of the sintered body by appropriately selecting the compound for liberating carbon, which is homogeneously dispersed in the unsintered body.

In a method of preparing a heat conductive colored aluminum nitride sintered body according to still another aspect of the present invention, at least 0.01 parts by weight and not more than 15 parts by weight of a rare earth element oxide in terms of the simple substance of the rare earth element, and at least one element selected from a group of oxides, carbides and nitrides of elements belonging to the groups IVB, VB and VIB of the periodic table in terms of the simple substance of the element are added to 100 parts by weight of aluminum nitride, to obtain a mixture. This mixture is shaped into a a desired configuration, to obtain a compact. This compact is fired in a non-oxidizing atmosphere containing at least 10 volume percent and not more than 100 volume percent of hydrocarbon gas under a temperature of at least 1500° C. and not more than 2100° C.

The hydrocarbon gas is introduced in order to eliminate oxygen from the system by chemical reaction. Therefore, any gas can be effectively employed so far as the same contains carbon. According to the present invention, however, it is preferable to use one of methane gas, ethylene gas, acetylene gas, propane gas and butane gas.

In the aforementioned method according to the first or second aspect of the present invention, the mixture is shaped into a compact and carbon or a compound liberating carbon is added to the compact, thereby eliminating oxygen, following part of the compound of the element belonging to the group IVB, VB or VIB of the periodic table solidly dissolving in the AlN particles, from the system by solid phase reaction with carbon. On the other hand, the feature of the method according to the third aspect of the present invention resides in that oxygen, following part of the element belonging to the group IVB, VB or VIB of the periodic table solidly dissolving in the AlN particles, is eliminated from the system by gas phase reaction with the hydrocarbon gas. The hydrocarbon gas, which has higher reactivity than carbon or that liberated from the compound, efficiently deoxidizes oxygen following the part of the compound of the element belonging to the group IVB, VB or VIB of the periodic table solidly dissolving in the AlN particles in a short time, to eliminate the same from the system. Therefore, it is possible to obtain a colored aluminum nitride sintered body having simultaneously high heat conductivity even if a relatively short firing pattern is employed In the method according to the first or second aspect of the present invention, unevenness may be caused in the composition, the color tone etc. of the sintered body, depending on the dispersed state of carbon or the compound liberating carbon. However, such unevenness is hardly caused in the method according to the third aspect of the present invention.

The rare earth element oxide is added in an amount of at least 0.01 parts by weight and not more than 15 parts by weight in terms of the simple substance of the rare earth element so that the as-formed aluminum nitride sintered body contains a rare earth aluminum nitride in the same range in terms of the simple substance of the rare earth element, for the following reason: If the amount is smaller than the lower limit of the above range, the absolute amount of the liquid phase of the rare earth aluminum oxide, being a composite oxide, is so insufficient that no dense sintered body can be obtained. If the amount exceeds the upper limit of the above range, on the other hand, an excess liquid phase exudes on the surface of the sintered body, to instabilize the color tone of the as-formed sintered body with spotting etc.

At least one element selected from the group of oxides, carbides and nitrides of the elements belonging to the groups IVB, VB and VIB of the periodic table is added in an amount of at least 0.01 parts by weight and not more than 15 parts by weight in terms of the simple substance of the rare earth element so that the as-formed aluminum nitride sintered body contains a compound containing the element in the same range, for the following reason: If the amount is smaller than the lower limit of the aforementioned range, the as-formed sintered body is insufficiently colored. If the amount exceeds the upper limit of the aforementioned range, on the other hand, it is impossible to obtain a dense sintered body since the compound of the element dissolves in the liquid phase of the rare earth aluminum oxide, being a composite oxide, to significantly block its wettability with respect to the AlN particles.

While the effect according to the present invention can be sufficiently attained by simply adding the aforementioned components to aluminum nitride, it is also possible to employ a well-known binder such as acrylic resin such as PVA, PVB or PMMA, paraffin or the like, in order to improve compactibility of the unsintered body. Further, 50 parts by weight of hexagonal BN may be contained in 100 parts by weight of AlN at the maximum, in order to improve various characteristics such as machinability.

In the method of preparing an aluminum nitride sintered body according to the present invention, a step of molding a mixture of a prescribed composition may be carried out by any method such as a doctor blade coater, press molding, CIP (cold isostatic pressing) or the like.

The as-formed heat conductive colored aluminum nitride sintered body satisfies the reciprocal requirements for heat conductivity and coloring property. When an IC chip is carried on a substrate of the inventive aluminum nitride sintered body, it is possible to suppress temperature rise caused by heating of the IC chip and transmission of ultraviolet rays from the exterior. Consequently, it is possible to reduce malfunctions of the IC chip. The substrate may be in any one of generally known forms such as DIP (dual in-line package), CERDIP (ceramic dual in-line package), LCC (leadless chip carrier), a flat package, PGA (pin grid array), a cerquad package, a hybrid package, a mother board and the like. The characteristics of the substrate, i.e., heat conductivity and coloring property, are not deteriorated in any of these forms. The inventive aluminum nitride sintered body, which is employed as a substrate material in any one of the aforementioned forms, generally comprises a conductor layer of tungsten etc., a sealing layer of glass etc., or a thin film circuit. An effect of such a conductor layer, sealing layer or thin film circuit will not be damaged in a substrate formed by the inventive aluminum nitride sintered body.

According to the present invention, as hereinabove described, it is possible to obtain a colored aluminum nitride sintered body having excellent heat conductivity. The inventive aluminum nitride sintered body is usefully applied to an electronic material for an IC package or a substrate, with a high industrial value.

DESCRIPTION OF THE PREFERRED EMBODIMENTS

Example 1

1 part by weight of carbon black having a BET value of 500 m$^2$/g, 1 part by weight of yttrium oxide in terms of the simple substance of yttrium, and 1 part by weight of titanium oxide in terms of the simple substance of titanium were added to 100 parts by weight of AlN powder having a mean particle diameter of 1 $\mu$m. A binder, a plasticizer, a deflocculant, a solvent, a wetting agent and an antielectrostatic agent were added to the powder, and mixed in a ball mill. The plasticizer was prepared from a mixture of dibutyl phthalate (DBP) and benzyl butyl phthalate (BBP) The deflocculant was prepared from menhaden fish oil. The solvent was prepared from a mixture of trichloroethylene, ethyl alcohol and methyethylketone. The wetting agent was prepared from glycerine monooleate. The as-formed slurry was defoamed, to prepare a green sheet of AlN by a doctor blade coater.

This green sheet was fired in a nitrogen atmosphere at a temperature of 1800° C. for 3 hours, to obtain a black sintered body.

Heat conductivity, measured by a laser flash method, of this sintered body was 150 W/m·K at the ordinary temperature.

This sintered body contained carbon, yttrium and titanium respectively in amounts of 0.03 parts by weight, 0.93 parts by weight and 0.85 parts by weight with respect to 100 parts by weight of AlN. A sample No. 1 shown in Tables 1 and 2 was formed by this aluminum nitride sintered body.

In a similar manner to the above, elements were blended in accordance with compositions shown in Table 1 to prepare compacts by a doctor blade coater, and the compacts were fired at temperatures in a range of 1500° to 2100° C. Table 2 shows color tones, heat conductivity values and contents of carbon, yttrium and elements (additives), belonging to the groups IVB, VB and VIB of the periodic table, of the as-formed sintered bodies.

Comparative Example 1

Elements were blended in accordance with compositions shown in Table 3 to prepare compacts by a doctor blade coater in a similar manner to Example 1, and then the compacts were fired at temperatures in a range of 1500° to 2100° C.

Table 4 shows color tones, heat conductivity values and contents of carbon, yttrium and elements (additives), belonging to the groups IVB, VB and VIB of the periodic table, of the as-formed sintered bodies.

Example 2

A prescribed amount of polyvinyl alcohol, serving as a compound liberating carbon, 1 part by weight of yttrium oxide in terms of the simple substance of yttrium, and 1 part by weight of titanium oxide in terms of the simple substance of titanium were added to 100 parts by weight of AlN powder having a mean particle diameter of 1 $\mu$m. A binder, a plasticizer, a solvent and a wetting agent were mixed into this powder in a ball mill. The binder was prepared from a mixture of ethylene vinyl acetate (EVA) and polypropylene (PP). The plasticizer was prepared from a mixture of dibutyl phthalate (DBP) and benzyl butyl phthalate (BBP). The solvent was prepared from butyl alcohol. The as-formed slurry was granulated by spray drying, and press-molded under a pressure of 1 ton/cm$^2$.

The as-formed compact was heat treated in a nitrogen atmosphere at a temperature of 1000° C. for 10 hours, to liberate carbon. The amount of free carbon was 0.88 parts by weight with respect to 100 parts by weight of AlN. Thereafter the compact was fired in a nitrogen atmosphere at a temperature of 2000° C. for 5 hours, to obtain a black sintered body.

The as-formed sintered body was subjected to measurement of heat conductivity at the ordinary temperature and contents of carbon, yttrium and titanium. As the result, the sintered body exhibited heat conductivity of 170 W/m·K and contents of carbon, yttrium and titanium of 0.01 parts by weight, 0.85 parts by weight and 0.88 parts by weight with respect to 100 parts by weight of AlN. A sample No. 31 shown in Tables 5, 6 and 7 was formed by this aluminum nitride sintered body.

In a similar manner to the above, elements were blended in accordance with compositions shown in Table 5, to prepare compacts by press molding. The compacts were heat treated under conditions shown in Table 6, to liberate carbon. Table 6 shows carbon contents after such heat treatment, with respect to 100 parts by weight of AlN. The heat treated compacts were fired at temperatures in a range of 1500° to 2100° C.

Table 7 shows color tones, heat conductivity values and contents of carbon, yttrium and elements (additives), belonging to the groups IVB, VB and VIB of the periodic table, of the as-formed sintered bodies.

Example 3

1 part by weight of yttrium oxide in terms of the simple substance of yttrium and 1 part by weight of titanium oxide in terms of the simple substance of titanium were added to 100 parts by weight of AlN powder having a mean particle diameter of 1 μm. Octadiene was added to this powder as a deflocculant, and then mixed with the same in methylisobutylketone in a ball mill. The as-formed slurry was dried under a temperature of 230° C., to prepare a compact by a CIP method. This compact was fired in a non-oxidizing atmosphere containing 30 volume percent of butane gas and a rest of ammonia gas at a temperature of 1800° C. for one hour. Thus, a black sintered body was obtained.

The as-formed sintered body was subjected to measurement of heat conductivity at the ordinary temperature and contents of carbon, yttrium and titanium, similarly to Example 1. As the result, the sintered body exhibited heat conductivity of 150 W/m·K and contents of carbon, yttrium and titanium of 0.01 parts by weight, 0.94 parts by weight and 0.97 parts by weight with respect to 100 parts by weight of AlN. A sample No. 55 shown in Tables 8, 9 and 10 was formed by this aluminum nitride sintered body.

In a similar manner to the above, elements were blended in accordance with compositions shown in Table 8, to prepare compacts by a CIP method. The compacts were fired in non-oxidizing atmospheres having compositions shown in Table 9 at temperatures in a range of 1500° to 2100° C.

Table 10 shows color tones, heat conductivity values and contents of carbon, yttrium and elements (additives), belonging to the groups IVB, VB and VIB of the periodic table, of the as-formed sintered bodies.

Example 4

20 parts by weight of hexagonal BN, 1 part by weight of carbon black having a BET value of 250 m$^2$/g, 1 part by weight of scandium oxide in terms of the simple substance of scandium, and 1 part by weight of titanium oxide in terms of the simple substance of titanium were added to 100 parts by weight of AlN powder having a mean particle diameter of 1 μm. A binder, a plasticizer, a solvent and a wetting agent were added to this powder and mixed in a ball mill. The binder was prepared from a mixture of ethylene vinyl acetate (EVA) and polypropylene (PP). The plasticizer was prepared from a mixture of dibutyl phthalate (DBP) and benzyl butyl phthalate (BBP). The solvent was prepared from butyl alcohol. The as-formed slurry was granulated by spray drying, and press-molded under a pressure of 1 ton/cm$^2$. The as-formed compact was fired in a nitrogen atmosphere at a temperature of 1900° C. for 2 hours. Thus, a black sintered body was obtained.

The as-formed sintered body was subjected to measurement of heat conductivity at the ordinary temperature and contents of carbon, scandium and titanium, similarly to Example 1. As the result, the sintered body exhibited heat conductivity of 130 W/m·K and contents of carbon, scandium and titanium of 0.02 parts by weight, 0.88 parts by weight and 0.81 parts by weight with respect to 100 parts by weight of AlN. A sample No. 79 shown in Tables 11 and 12 was formed by this aluminum nitride sintered body.

In a similar manner, titanium oxide having rutile-type crystals was employed as a compound containing an element belonging to the group IVB, VB or VIB of the periodic table and blended in accordance with compositions shown in Table 11, to prepare compacts by press molding. The compacts were fired at temperatures in a range of 1500° to 2100° C.

Table 12 shows color tones, heat conductivity values and contents of carbon, rare earth elements and titanium of the as-formed sintered bodies.

Example 5

Tungsten oxide was employed as a compound containing an element belonging to the group IVB, VB or VIB of the periodic table and blended in accordance with compositions shown in Table 13, to prepare compacts by a doctor blade coater, similarly to Example 1. The compacts were fired at temperatures in a range of 1500° to 2100° C.

Table 14 shows color tones, heat conductivity values and contents of carbon, rare earth elements and tungsten of the as-formed sintered bodies.

Comparative Example 2

Tungsten oxide was employed as a compound containing an element belonging to the group IVB, VB or VIB of the periodic table and blended in accordance with compositions shown in Table 15, to prepare compacts by a doctor blade coater similarly to Example 1. The compacts were fired at temperatures in a range of 1500° to 2100° C.

Table 16 shows color tones, heat conductivity values and contents of carbon, rare earth elements and tungsten of the as-formed sintered bodies.

Comparing the heat conductivity values and the color tones of the samples obtained according to the aforementioned Examples and comparative examples, the inventive samples exhibited heat conductivity values of at least 100 W/m·K with colors of gray or black. On the other hand, black comparative samples exhibited heat conductivity values of less than 100 W/m·K, while those exhibiting heat conductivity values exceeding 100 W/m·K were merely colored in white or spotted.

TABLE 1

| Inventive Sample No. | Additional Amount of Carbon (wt. part) | Additional Amount of Yttrium (wt. part) | Additional Amount of Additive (wt. part) | Additional Compound |
|---|---|---|---|---|
| 1 | 1.00 | 1.00 | 1.00 | TiO$_2$ |
| 2 | 0.01 | 1.00 | 1.00 | TiO$_2$ |
| 3 | 0.50 | 0.01 | 1.00 | ZrO$_2$ |
| 4 | 1.00 | 1.00 | 0.01 | ZrO$_2$ |
| 5 | 3.00 | 1.00 | 1.00 | HfO$_2$ |
| 6 | 5.00 | 1.00 | 1.00 | V$_2$O$_5$ |
| 7 | 1.00 | 3.00 | 1.00 | Nb$_2$O$_5$ |
| 8 | 1.00 | 5.00 | 1.00 | Ta$_2$O$_5$ |
| 9 | 1.00 | 10.00 | 1.00 | Cr$_2$O$_3$ |
| 10 | 1.00 | 15.00 | 1.00 | CrO$_3$ |
| 11 | 1.00 | 1.00 | 3.00 | MoO$_3$ |
| 12 | 1.00 | 1.00 | 5.00 | WO$_3$ |
| 13 | 1.00 | 1.00 | 10.00 | WO$_3$ |
| 14 | 1.00 | 1.00 | 15.00 | WO$_3$ |
| 15 | 3.00 | 3.00 | 3.00 | TiN |
| 16 | 3.00 | 7.50 | 3.00 | TiC |
| 17 | 3.00 | 3.00 | 7.50 | ZrO$_2$ |
| 18 | 1.00 | 5.00 | 10.00 | TiO$_2$ |
| 19 | 5.00 | 1.00 | 10.00 | TiO$_2$ |
| 20 | 1.00 | 10.00 | 5.00 | TiO$_2$ |
| 21 | 0.50 | 0.50 | 0.50 | WO$_3$ |
| 22 | 1.00 | 0.50 | 0.50 | WO$_3$ |
| 23 | 0.50 | 1.00 | 0.50 | WO$_3$ |
| 24 | 0.50 | 0.50 | 1.00 | WO$_3$ |

TABLE 2

| Inventive Sample No. | Color Tone | Heat conductivity W/m·K | Carbon Content (wt. part) | Yttrium Content (wt. part) | Additive Content (wt. part) |
|---|---|---|---|---|---|
| 1 | Black | 150 | 0.03 | 0.93 | 0.85 |
| 2 | Black | 110 | 0.005 | 0.88 | 0.81 |
| 3 | Black | 100 | 0.008 | 0.01 | 0.98 |
| 4 | Gray | 180 | 0.05 | 0.95 | 0.01 |
| 5 | Black | 230 | 0.10 | 0.99 | 0.85 |
| 6 | Black | 270 | 0.48 | 0.85 | 0.78 |
| 7 | Black | 190 | 0.04 | 2.73 | 0.87 |
| 8 | Gray | 250 | 0.05 | 4.58 | 0.94 |
| 9 | Black | 220 | 0.07 | 9.11 | 0.79 |
| 10 | Gray | 140 | 0.03 | 14.15 | 0.85 |
| 11 | Black | 130 | 0.06 | 0.90 | 2.38 |
| 12 | Black | 120 | 0.05 | 0.88 | 4.13 |
| 13 | Black | 110 | 0.02 | 0.83 | 8.85 |
| 14 | Black | 100 | 0.03 | 0.92 | 13.23 |
| 15 | Gray | 200 | 0.11 | 2.85 | 2.40 |
| 16 | Brown | 140 | 0.13 | 7.20 | 2.31 |
| 17 | Black | 150 | 0.12 | 2.57 | 6.72 |
| 18 | Black | 170 | 0.05 | 4.52 | 9.26 |
| 19 | Black | 210 | 0.37 | 0.82 | 8.98 |
| 20 | Black | 200 | 0.06 | 8.79 | 4.30 |
| 21 | Black | 150 | 0.01 | 0.43 | 0.38 |
| 22 | Black | 190 | 0.04 | 0.40 | 0.41 |
| 23 | Black | 180 | 0.02 | 0.85 | 0.37 |
| 24 | Black | 120 | 0.02 | 0.45 | 0.78 |

TABLE 3

| Comparative Sample No. | Additional Amount of Carbon (wt. part) | Additional Amount of Yttirum (wt. part) | Additional Amount of Additive (wt. part) | Additional Compound |
|---|---|---|---|---|
| 25 | 0.00 | 1.00 | 1.00 | TiO$_2$ |
| 26 | 1.00 | 0.00 | 1.00 | ZrO$_2$ |
| 27 | 1.00 | 1.00 | 0.00 | HfO$_2$ |
| 28 | 6.00 | 1.00 | 1.00 | V$_2$O$_5$ |
| 29 | 1.00 | 20.00 | 1.00 | MoO$_2$ |
| 30 | 1.00 | 1.00 | 20.00 | WO$_3$ |

TABLE 4

| Comparative Sample No. | Color Tone | Heat Conductivity W/m·K | Carbon Content (wt. part) | Yttrium Content (wt. part) | Additive Content (wt. part) |
|---|---|---|---|---|---|
| 25 | Black | 60 | 0.002 | 0.93 | 0.88 |
| 26 | White | 50 | 0.03 | 0.00 | 0.83 |
| 27 | White | 170 | 0.05 | 0.85 | 0.00 |
| 28 | Whitened | not densified | 0.72 | 0.82 | 0.90 |
| 29 | Spotted | 120 | 0.06 | 16.32 | 0.71 |
| 30 | Whitened | not densified | 0.04 | 0.87 | 15.55 |

TABLE 5

| Inventive Sample No. | Additional Compound (Liberating Carbon) | Additional Amount of Yttrium (wt. part) | Additional Amount of Additive (wt. part) | Additionl Compound |
|---|---|---|---|---|
| 31 | polyvinyl alcohol | 1.00 | 1.00 | TiO$_2$ |
| 32 | polyvinyl alcohol | 1.00 | 1.00 | ZrO$_2$ |
| 33 | polyvinyl butyral | 0.01 | 1.00 | WO$_3$ |
| 34 | polyethylene terephthalate | 1.00 | 0.01 | WO$_3$ |
| 35 | glucose | 1.00 | 1.00 | MoO$_3$ |
| 36 | fructose | 1.00 | 1.00 | CrO$_3$ |
| 37 | sucrose | 3.00 | 1.00 | Ta$_2$O$_5$ |
| 38 | polyvinyl alcohol | 5.00 | 1.00 | Nb$_2$O$_5$ |
| 39 | polyvinyl butyral | 10.00 | 1.00 | V$_2$O$_5$ |
| 40 | sucrose | 15.00 | 1.00 | HfO$_2$ |
| 41 | polyacrylonitrile | 1.00 | 3.00 | ZrO$_2$ |
| 42 | polyvinyl alcohol | 1.00 | 5.00 | TiO$_2$ |
| 43 | polyethylene terephtalate | 1.00 | 10.00 | TiN |
| 44 | polyvinyl butyral | 1.00 | 15.00 | TiC |
| 45 | fructose. | 3.00 | 3.00 | WC |
| 46 | glucose | 7.50 | 3.00 | WC |
| 47 | polyvinyl butyral | 3.00 | 7.50 | W$_2$C |
| 48 | sucrose | 5.00 | 10.00 | WO$_3$ |
| 49 | polyvinyl alcohol | 1.00 | 10.00 | WO$_3$ |
| 50 | polyacrylonitrile | 10.00 | 5.00 | WO$_3$ |
| 51 | glucose | 0.50 | 0.50 | TiO$_2$ |
| 52 | polyethylene terephthalate | 0.50 | 0.50 | TiO$_2$ |
| 53 | sucrose | 1.00 | 0.50 | ZrO$_2$ |
| 54 | polyvinyl butyral | 0.50 | 1.00 | ZrO$_2$ |

TABLE 6

| Inventive Sample No. | Heat Treatment Temperature (°C.) | Heat Treatment Time (h.) | Carbon Content (wt. part) |
|---|---|---|---|
| 31 | 1000 | 10 | 0.88 |
| 32 | 500 | 2 | 0.01 |
| 33 | 150 | 10 | 0.50 |
| 34 | 1200 | 5 | 1.11 |
| 35 | 800 | 2 | 2.70 |
| 36 | 500 | 2 | 4.88 |
| 37 | 300 | 5 | 1.15 |
| 38 | 1500 | 2 | 0.91 |
| 39 | 1200 | 5 | 1.06 |
| 40 | 500 | 10 | 0.82 |
| 41 | 1000 | 2 | 1.27 |
| 42 | 300 | 5 | 0.96 |
| 43 | 800 | 2 | 1.00 |
| 44 | 150 | 5 | 1.35 |
| 45 | 1500 | 5 | 3.19 |
| 46 | 800 | 10 | 3.25 |
| 47 | 500 | 2 | 3.40 |
| 48 | 1200 | 5 | 0.98 |
| 49 | 1000 | 10 | 4.37 |
| 50 | 500 | 10 | 1.03 |
| 51 | 1500 | 5 | 0.52 |
| 52 | 1200 | 2 | 1.09 |
| 53 | 500 | 5 | 0.47 |
| 54 | 300 | 10 | 0.50 |

TABLE 7

| Inventive Sample No. | Color Tone | Heat conductivity W/m·K | Carbon Content (wt. part) | Yttrium Content (wt. part) | Additive Content (wt. part) |
|---|---|---|---|---|---|
| 31 | Black | 170 | 0.01 | 0.85 | 0.88 |
| 32 | Black | 120 | 0.005 | 0.83 | 0.87 |
| 33 | Black | 100 | 0.01 | 0.01 | 0.81 |
| 34 | Gray | 180 | 0.06 | 0.88 | 0.01 |
| 35 | Black | 220 | 0.15 | 0.80 | 0.77 |
| 36 | Black | 260 | 0.43 | 0.75 | 0.78 |
| 37 | Black | 190 | 0.03 | 2.65 | 0.83 |
| 38 | Gray | 260 | 0.02 | 4.53 | 0.79 |
| 39 | Black | 240 | 0.04 | 9.22 | 0.84 |
| 40 | Black | 150 | 0.03 | 13.99 | 0.85 |
| 41 | Black | 130 | 0.05 | 0.91 | 2.56 |
| 42 | Black | 130 | 0.02 | 0.84 | 4.12 |
| 43 | Gray | 120 | 0.02 | 0.82 | 9.05 |
| 44 | Black | 100 | 0.01 | 0.86 | 13.78 |
| 45 | Black | 220 | 0.10 | 2.65 | 2.50 |
| 46 | Black | 180 | 0.13 | 7.11 | 2.36 |
| 47 | Black | 150 | 0.11 | 2.42 | 6.67 |
| 48 | Black | 170 | 0.03 | 4.59 | 9.22 |
| 49 | Black | 210 | 0.31 | 0.79 | 8.84 |
| 50 | Black | 200 | 0.03 | 8.81 | 4.38 |
| 51 | Black | 140 | 0.01 | 0.38 | 0.41 |
| 52 | Black | 170 | 0.03 | 0.40 | 0.36 |
| 53 | Black | 170 | 0.008 | 0.82 | 0.38 |

TABLE 7-continued

| Inventive Sample No. | Color Tone | Heat conductivity W/m·K | Carbon Content (wt. part) | Yttrium Content (wt. part) | Additive Content (wt. part) |
|---|---|---|---|---|---|
| 54 | Black | 120 | 0.01 | 0.40 | 0.86 |

TABLE 8

| Inventive Sample No. | Additional Amount Of Yttrium (wt. part) | Additional Amount Of Additive (wt. part) | Additional Compound |
|---|---|---|---|
| 55 | 1.00 | 1.00 | $TiO_2$ |
| 56 | 1.00 | 1.00 | $TiO_2$ |
| 57 | 0.01 | 1.00 | $TiO_2$ |
| 58 | 1.00 | 0.01 | $TiO_2$ |
| 59 | 1.00 | 1.00 | $ZrO_2$ |
| 60 | 1.00 | 1.00 | $HfO_2$ |
| 61 | 3.00 | 1.00 | $V_2O_5$ |
| 62 | 5.00 | 1.00 | $V_2O_3$ |
| 63 | 10.00 | 1.00 | $Nb_2O_5$ |
| 64 | 15.00 | 1.00 | $Ta_2O_5$ |
| 65 | 1.00 | 3.00 | $CrO_3$ |
| 66 | 1.00 | 5.00 | $MoO_3$ |
| 67 | 1.00 | 10.00 | $WO_3$ |
| 68 | 1.00 | 15.00 | $WO_3$ |
| 69 | 3.00 | 3.00 | $MoO_3$ |
| 70 | 7.50 | 3.00 | $MoO_3$ |
| 71 | 3.00 | 7.50 | $MoO_3$ |
| 72 | 5.00 | 10.00 | $ZrO_2$ |
| 73 | 1.00 | 10.00 | $ZrO_2$ |
| 74 | 10.00 | 5.00 | $ZrO_2$ |
| 75 | 0.50 | 0.50 | TiN |
| 76 | 0.50 | 0.50 | TiN |
| 77 | 1.00 | 0.50 | TiN |
| 78 | 0.50 | 1.00 | TiN |

TABLE 9

| Inventive Sample No. | Hydrocarbon Gas (vol. %) | Gas Type | Rest Gas |
|---|---|---|---|
| 55 | 30.0 | Butane Gas | Ammonia Gas |
| 56 | 20.0 | Propane Gas | Nitrogen Gas |
| 57 | 25.0 | Propane Gas | Nitrogen Gas |
| 58 | 30.0 | Propane Gas | Nitrogen Gas |
| 59 | 60.0 | Propane Gas | Argon Gas |
| 60 | 100.0 | Propane Gas | — |
| 61 | 30.0 | Ethylene Gas | Argon Gas |
| 62 | 30.0 | Ethylene Gas | Nitrogen Gas |
| 63 | 30.0 | Ethylene Gas | Nitrogen Gas |
| 64 | 30.0 | Ethylene Gas | Ammonia Gas |
| 65 | 30.0 | Acetylene Gas | Nitrogen Gas |
| 66 | 30.0 | Acetylene Gas | Nitrogen Gas |
| 67 | 30.0 | Acetylene Gas | Nitrogen Gas |
| 68 | 30.0 | Acetylene Gas | Nitrogen Gas |
| 69 | 50.0 | Methane Gas | Nitrogen Gas |
| 70 | 50.0 | Methane Gas | Nitrogen Gas |
| 71 | 50.0 | Methane Gas | Nitrogen Gas |
| 72 | 30.0 | Butane Gas | Ammonia Gas |
| 73 | 100.0 | Butane Gas | — |
| 74 | 30.0 | Butane Gas | Nitrogen Gas |
| 75 | 20.0 | Methane Gas | Ammonia Gas |
| 76 | 30.0 | Methane Gas | Ammonia Gas |
| 77 | 20.0 | Methane Gas | Nitrogen Gas |
| 78 | 20.0 | Methane Gas | Nitrogen Gas |

TABLE 10

| Inventive Sample No. | Color Tone | Heat conductivity (W/m·K) | Carbon Content (wt. part) | Yttrium Content (wt. part) | Additive Content (wt. part) |
|---|---|---|---|---|---|
| 55 | Black | 150 | 0.01 | 0.94 | 0.97 |
| 56 | Black | 120 | 0.007 | 0.89 | 0.92 |
| 57 | Black | 150 | 0.02 | 0.01 | 0.79 |
| 58 | Gray | 170 | 0.03 | 0.83 | 0.01 |
| 59 | Black | 200 | 0.11 | 0.78 | 0.91 |
| 60 | Black | 240 | 0.21 | 0.85 | 0.82 |
| 61 | Black | 160 | 0.07 | 2.69 | 0.80 |
| 62 | Gray | 190 | 0.03 | 4.65 | 0.91 |
| 63 | Black | 210 | 0.05 | 9.04 | 0.83 |
| 64 | Black | 190 | 0.04 | 13.86 | 0.84 |
| 65 | Black | 160 | 0.02 | 0.92 | 2.83 |
| 66 | Black | 140 | 0.01 | 0.87 | 4.61 |
| 67 | Black | 130 | 0.03 | 0.90 | 9.18 |
| 68 | Black | 110 | 0.02 | 0.79 | 13.94 |
| 69 | Black | 220 | 0.07 | 2.80 | 2.75 |
| 70 | Black | 210 | 0.09 | 7.12 | 2.39 |
| 71 | Black | 180 | 0.10 | 2.52 | 6.87 |
| 72 | Black | 180 | 0.03 | 4.35 | 9.09 |
| 73 | Black | 190 | 0.25 | 0.85 | 9.00 |
| 74 | Black | 190 | 0.05 | 8.66 | 4.16 |
| 75 | Black | 130 | 0.008 | 0.38 | 0.36 |
| 76 | Black | 160 | 0.01 | 0.37 | 0.41 |
| 77 | Black | 140 | 0.02 | 0.83 | 0.40 |
| 78 | Black | 100 | 0.01 | 0.40 | 0.85 |

TABLE 11

| Inventive Sample No. | Additional Amount of Carbon (wt. part) | Additional Amount of Rare Earth Element (wt. part) | Additional Amount of $TiO_2$ (in terms of Ti) (wt. part) | Additional Rare Earth Element |
|---|---|---|---|---|
| 79 | 1.00 | 1.00 | 1.00 | $Sc_2O_3$ |
| 80 | 1.00 | 1.00 | 1.00 | $Y_2O_3$ |
| 81 | 1.00 | 1.00 | 1.00 | $La_2O_3$ |
| 82 | 1.00 | 1.00 | 1.00 | $Ce_2O_3$ |
| 83 | 3.00 | 3.00 | 3.00 | $Sc_2O_3$ |
| 84 | 3.00 | 3.00 | 3.00 | $Y_2O_3$ |
| 85 | 3.00 | 3.00 | 3.00 | $La_2O_3$ |
| 86 | 3.00 | 3.00 | 3.00 | $Ce_2O_3$ |
| 87 | 0.50 | 0.50 | 0.50 | $Sc_2O_3$ |
| 88 | 0.50 | 0.50 | 0.50 | $Y_2O_3$ |
| 89 | 0.50 | 0.50 | 0.50 | $La_2O_3$ |
| 90 | 0.50 | 0.50 | 0.50 | $Ce_2O_3$ |

TABLE 12

| Inventive Sample No. | Color Tone | Heat Conductivity (W/m·k) | Carbon Content (wt. part) | Rare Earth Element Content (wt. part) | Ti Content (wt. part) |
|---|---|---|---|---|---|
| 79 | Black | 130 | 0.02 | 0.88 | 0.81 |
| 80 | Black | 150 | 0.03 | 0.93 | 0.85 |
| 81 | Black | 120 | 0.03 | 0.90 | 0.88 |
| 82 | Black | 130 | 0.04 | 0.85 | 0.86 |
| 83 | Black | 190 | 0.10 | 2.69 | 2.55 |
| 84 | Gray | 200 | 0.11 | 2.85 | 2.40 |
| 85 | Black | 190 | 0.09 | 2.63 | 2.67 |
| 86 | Gray | 210 | 0.10 | 2.78 | 2.54 |
| 87 | Black | 110 | 0.008 | 0.41 | 0.39 |
| 88 | Black | 140 | 0.01 | 0.39 | 0.41 |
| 89 | Black | 130 | 0.02 | 0.40 | 0.38 |
| 90 | Black | 120 | 0.01 | 0.38 | 0.43 |

TABLE 13

| Inventive Sample No. | Additional Amount of Carbon (wt. part) | Additional Amount of Rare Earth Element (wt. part) | Additional Amount of $WO_3$ (in terms of W) (wt. part) | Additional Rare Earth Element |
|---|---|---|---|---|
| 91 | 1.00 | 1.00 | 1.00 | $Sc_2O_3$ |
| 92 | 1.00 | 1.00 | 1.00 | $Y_2O_3$ |
| 93 | 1.00 | 1.00 | 1.00 | $La_2O_3$ |

TABLE 13-continued

| Inventive Sample No. | Additional Amount of Carbon (wt. part) | Additional Amount of Rare Earth Element (wt. part) | Additional Amount of WO3 (in terms of W) (wt. part) | Additional Rare Earth Element |
|---|---|---|---|---|
| 94 | 1.00 | 1.00 | 1.00 | Ce2O3 |
| 95 | 3.00 | 3.00 | 3.00 | Sc2O3 |
| 96 | 3.00 | 3.00 | 3.00 | Y2O3 |
| 97 | 3.00 | 3.00 | 3.00 | La2O3 |
| 98 | 3.00 | 3.00 | 3.00 | Ce2O3 |
| 99 | 0.50 | 0.50 | 0.50 | Sc2O3 |
| 100 | 0.50 | 0.50 | 0.50 | Y2O3 |
| 101 | 0.50 | 0.50 | 0.50 | La2O3 |
| 102 | 0.50 | 0.50 | 0.50 | Ca2O3 |

TABLE 14

| Inventive Sample No. | Color Tone | Hest Conductivity (W/m·k) | Carbon Content (wt. part) | Rare Earth Element Content (wt. part) | Ti Content (wt. part) |
|---|---|---|---|---|---|
| 91 | Black | 140 | 0.03 | 0.91 | 0.86 |
| 92 | Black | 170 | 0.02 | 0.89 | 0.81 |
| 93 | Black | 160 | 0.03 | 0.88 | 0.90 |
| 94 | Black | 130 | 0.03 | 0.90 | 0.91 |
| 95 | Black | 190 | 0.12 | 2.70 | 2.63 |
| 96 | Black | 210 | 0.10 | 2.75 | 2.58 |
| 97 | Black | 180 | 0.09 | 2.68 | 2.71 |
| 98 | Black | 210 | 0.10 | 2.78 | 2.54 |
| 99 | Black | 120 | 0.01 | 0.39 | 0.42 |
| 100 | Black | 150 | 0.02 | 0.40 | 0.38 |
| 101 | Black | 140 | 0.02 | 0.37 | 0.41 |
| 102 | Black | 140 | 0.01 | 0.38 | 0.40 |

TABLE 15

| Comparative Sample No. | Additional Amount of Carbon (wt. part) | Additional Amount of Rare Earth Element (wt. part) | Additional Amount of WO3 (in terms of W) (wt. part) | Additional Rare Earth Element |
|---|---|---|---|---|
| 103 | 0.00 | 1.00 | 1.00 | Sc2O3 |
| 104 | 0.00 | 1.00 | 1.00 | Y2O3 |
| 105 | 0.00 | 1.00 | 1.00 | La2O3 |
| 106 | 0.00 | 1.00 | 1.00 | Ce2O3 |
| 107 | 1.00 | 20.00 | 1.00 | Sc2O3 |
| 108 | 1.00 | 20.00 | 1.00 | Y2O3 |
| 109 | 1.00 | 20.00 | 1.00 | La2O3 |
| 110 | 1.00 | 20.00 | 1.00 | Ce2O3 |
| 111 | 1.00 | 1.00 | 0.00 | Sc2O3 |
| 112 | 1.00 | 1.00 | 0.00 | Y2O3 |
| 113 | 1.00 | 1.00 | 0.00 | La2O3 |
| 114 | 1.00 | 1.00 | 0.00 | Ce2O3 |
| 115 | 1.00 | 1.00 | 20.00 | Sc2O3 |
| 116 | 1.00 | 1.00 | 20.00 | Y2O3 |
| 117 | 1.00 | 1.00 | 20.00 | La2O3 |
| 118 | 1.00 | 1.00 | 20.00 | Ce2O3 |

TABLE 16

| Inventive Sample No. | Color Tone | Heat Conductivity (W/m·k) | Carbon Content (wt. part) | Rare Earth Element Content (wt. part) | W Content (wt. part) |
|---|---|---|---|---|---|
| 103 | Black | 50 | 0.002 | 0.92 | 0.87 |
| 104 | Black | 70 | 0.001 | 0.90 | 0.82 |
| 105 | Black | 60 | 0.002 | 0.89 | 0.88 |
| 106 | Black | 60 | 0.001 | 0.87 | 0.85 |
| 107 | Spotted in Gray | 130 | 0.03 | 17.01 | 0.82 |
| 108 | Spotted in White | 120 | 0.02 | 16.78 | 0.91 |
| 109 | Spotted in Yellow | 120 | 0.02 | 17.11 | 0.88 |
| 110 | Spotted in White | 100 | 0.04 | 16.86 | 0.89 |
| 111 | White | 160 | 0.05 | 0.85 | 0.00 |
| 112 | White | 160 | 0.03 | 0.92 | 0.00 |
| 113 | White | 150 | 0.03 | 0.87 | 0.00 |
| 114 | White | 140 | 0.04 | 0.86 | 0.00 |
| 115 | Whitened | not densified | 0.05 | 0.88 | 16.58 |
| 116 | Whitened | not densified | 0.04 | 0.87 | 15.55 |
| 117 | Whitened | not densified | 0.03 | 0.91 | 16.03 |
| 118 | Whitened | not densified | 0.04 | 0.89 | 15.94 |

Example 6

A green sheet having the same composition as the sample No. 1 was prepared. A caking additive such as polyvinyl alcohol, polymethyl methacrylate or ethyl cellulose was mixed with a solvent such as butyl carbitol or α-terpineol, to prepare a vehicle. Thereafter tungsten powder of 2 μm in mean particle diameter was mixed with this vehicle in a weight ratio 100:20, to prepare metallized paste. The as-formed metallized paste was applied onto the green sheet by screen printing, and the green sheet was subjected to sheet working and lamination. Then the green sheet coated with the metallized paste was fired in a nitrogen atmosphere at a temperature of 1800° C. for one hour. Nickel plating, brazing and gold plating were performed on the as-formed sintered body, to prepare a flat package.

An IC chip having an output of 2 W was joined/packaged onto the flat package with gold silicon solder in the air at a temperature of 300° C. This IC chip was bonded by hot ultrasonic bonding using a gold wire, and driven. The temperature of the IC chip remained at 52° C., which was lower by 13° C. than that resulting from a test made on a similar green sheet having the same composition as the sample No. 25 (comparative example).

It was recognized that insulability was remarkably excellent with interwiring insulation resistance of $10^{14}$ Ω·cm. In order to measure adhesion strength between a tungsten conductor layer formed by the aforementioned metallized paste and the heat conductive colored aluminum sintered body, a wire was soldered to a portion 1 mm square after gold plating and perpendicularly pulled with respect to the substrate. As the result, it was confirmed that adhesion strength was at a practically nonproblematic value of 3.5 kg/mm².

Example 7

The sintered body of the sample No. 1 was metallized with gold, and a lead frame of an iron-nickel-cobalt alloy was joined thereto with fusible glass, to prepare a ceramic quad flat package (QFP). An IC chip having an output of 2 W was carried on the as-formed package by a method similar to that in Example 6 and driven. The temperature of this IC chip remained at 56° C., which was lower by 21° C. than that resulting from a test made on a ceramic quad flat package similarly prepared from the sintered body of the sample No. 25 (comparative example).

It was recognized that insulability was remarkably excellent with interwiring insulation resistance of $10^{14}$ Ω·cm. It was also confirmed that airtightness measured with a helium leak checker was at a practically nonproblematic level of $1 \times 10^{-8}$ atm·cc/sec.

Example 8

The sintered body of the sample No. 1 was metallized with gold, and a lead frame of an iron-nickel-cobalt alloy was joined thereto with fusible glass, to prepare a ceramic QFP. A copper wiring pattern was formed on a polyimide film, and an IC chip having an output of 2 W was carried thereon with a gold bump. This structure was joined/packaged onto the ceramic QFP with gold silicon solder in the air at a temperature of 300° C., and then the IC chip was driven. The temperature of the IC chip remained at 60° C., which was lower by 26° C. than that resulting from a test made on a ceramic QFP prepared from a green sheet of the same composition as the sample No. 25 (comparative example).

It was confirmed that insulability was remarkably excellent with interwiring insulation resistance of $10^{14}$ Ω·cm. It was also confirmed that airtightness measured with a helium leak checker was at a practically nonproblematic level of $1 \times 10^{-8}$ atm·cc/sec.

Example 9

A green sheet having the same composition as the sample No. 1 was prepared. A caking additive such as polyvinyl alcohol, polymethyl methacrylate or ethyl cellulose was mixed with a solvent such as butyl carbitol or α-terpineol, to prepare a vehicle. Thereafter tungsten powder of 2 μm in mean particle diameter was mixed with this vehicle in a weight ratio 10:20, to prepare metallized paste. The as-formed metallized paste was applied onto the green sheet by screen printing, and the green sheet was subjected to sheet working and lamination. The green sheet coated with the metallized paste was fired in a nitrogen atmosphere at a temperature of 1750° C. for 2 hours. Further, nickel plating, brazing and gold plating were performed on the as-formed sintered body, to prepare a pin grid array (PGA).

An IC chip having an output of 2 W was joined/packaged onto the as-formed package with gold silicon solder, in the air at a temperature of 300° C. The IC chip was bonded by hot ultrasonic bonding with a gold wire, and then driven. The temperature of the IC chip remained at 30° C., which was lower by 9° C. than that resulting from a test made on a flat package prepared from a green sheet having the same composition as the sample No. 25 (comparative example).

It was confirmed that insulability was remarkably excellent with interwiring insulation resistance of $10^{14}$ Ω·cm. In order to measure adhesion strength between a tungsten conductor layer formed by the aforementioned metallized paste and the heat conductive aluminum nitride sintered body, a pin of an iron-nickel-cobalt alloy, which was joined to the substrate through the conductor layer, was perpendicularly pulled with respect to the substrate. As the result, it was confirmed that the adhesion strength was at a practically nonproblematic level of 3.7 kg/mm$^2$.

Example 10

A green sheet having the same composition as the sample No. 1 was prepared. A caking additive such as polyvinyl alcohol, polymethyl methacrylate or ethyl cellulose was mixed with a solvent such as butyl carbitol or α-terpineol, to prepare a vehicle. Thereafter tungsten powder of 2 μm in mean particle diameter was mixed with this vehicle in a weight ratio 100:20, to prepare metallized paste. The metallized paste was applied onto the green sheet by screen printing, and the green sheet was subjected to sheet working and lamination. The green sheet coated with the metallized paste was fired in a nitrogen atmosphere at a temperature of 1850° C. for 3 hours. Further, nickel plating and gold plating were performed on the as-formed sintered body, to prepare a leadless chip carrier (LCC).

An IC chip having an output of 2 W was joined/packaged onto this LCC with gold silicon solder, in the air at a temperature of 300° C. The IC chip was bonded by hot ultrasonic bonding with a gold wire, and then driven. The temperature of the IC chip remained at 33° C., which was lower by 12° C. than that resulting from a test made on a flat package prepared from a green sheet having the same composition as the sample No. 25 (comparative example).

It was confirmed that insulability was remarkably excellent with interwiring insulation resistance of $10^{14}$ Ω·cm. In order to measure adhesion strength between a tungsten conductor layer formed by the metallized paste and the heat conductive colored aluminum nitride sintered body, gold plating was performed on the conductor layer, and a wire was soldered to a portion 1 mm square and perpendicularly pulled with respect to the substrate. As the result, it was confirmed that the adhesion strength was at a practically nonproblematic level of 3.8 kg/mm$^2$.

According to the present invention, as hereinabove described, it is possible to obtain a colored aluminum nitride sintered body which has excellent heat conductivity. The inventive aluminum sintered body is usefully applied to an electronic material for an PC package, a substrate or the like, with a high industrial value.

What is claimed is:

1. A method of preparing a heat conductive colored aluminum nitride sintered body, comprising the steps of: mixing at least 0.01 parts by weight and not more than 15 parts by weight of an oxide of a rare earth element in terms of the simple substance of said rare earth element, and at least 0.01 parts by weight and not more than 15 parts by weight of at least one element selected from a group consisting of oxides, carbides and nitrides of elements belonging to the groups IVB, VB and VIB of the periodic table in terms of the simple substance of said element and 100 parts by weight of aluminum nitride, thereby obtaining a mixture; shaping said mixture into a compact; and firing said compact in a non-oxidizing atmosphere containing at least 10 volume percent and not more than 100 volume percent of hydrocarbon gas selected from the group consisting of methane gas, ethylene gas, acetylene gas, propane gas and butane gas under a temperature of at least 1500° C. and not more than 2100° C., said hydrocarbon gas eliminating oxygen by chemical reaction, whereby said aluminum nitride sintered body has a uniformly distributed dark color within the range of gray to black and simultaneously a thermal conductivity within the range of 100 W/m·K to 270 W/m·K.

* * * * *

UNITED STATES PATENT AND TRADEMARK OFFICE
CERTIFICATE OF CORRECTION

PATENT NO. : 5,294,388
DATED : March 15, 1994
INVENTOR(S) : Shimoda et al.

It is certified that error appears in the above-indentified patent and that said Letters Patent is hereby corrected as shown below:

Cover page, delete all text title page and cols. and insert the attached.

Signed and Sealed this

Twenty-fifth Day of July, 1995

*Attest:*

BRUCE LEHMAN

*Attesting Officer*     *Commissioner of Patents and Trademarks*

United States Patent [19]

Shimoda et al.

[11] Patent Number: 5,294,388

[45] Date of Patent: * Mar. 15, 1994

[54] HEAT CONDUCTIVE COLORED ALUMINUM NITRIDE SINTERED BODY

[75] Inventors: Kouhei Shimoda; Takao Maeda; Kouichi Sogabe; Masaya Miyake, all of Hyogo, Japan

[73] Assignee: Sumitomo Electric Industries, Ltd., Osaka, Japan

[ * ] Notice: The portion of the term of this patent subsequent to Sep. 15, 2009 has been disclaimed.

[21] Appl. No.: 922,682

[22] Filed: Jul. 29, 1992

Related U.S. Application Data

[62] Division of Ser. No. 686,618, Apr. 17, 1991, abandoned.

[30] Foreign Application Priority Data

Apr. 17, 1990 [JP] Japan ................................. 2-101396

[51] Int. Cl.$^5$ .......................... F27B 9/04; C04B 35/58
[52] U.S. Cl. ......................................... 264/65; 501/96; 501/98; 501/153
[58] Field of Search ................ 501/96, 98, 92, 99, 501/100, 153; 264/29.1, 29.6, 29.7, 63, 65, 66

[56] References Cited

U.S. PATENT DOCUMENTS

| | | | |
|---|---|---|---|
| 4,435,513 | 3/1984 | Komeya et al. | 501/96 |
| 4,478,785 | 10/1984 | Huseby et al. | 264/65 |
| 4,533,645 | 8/1985 | Huseby et al. | 501/96 |
| 4,578,365 | 3/1986 | Huseby et al. | 501/98 |
| 4,877,760 | 10/1989 | Okuno et al. | 501/98 |
| 5,034,357 | 7/1991 | Yamakawa et al. | 501/96 |
| 5,085,923 | 2/1992 | Yamakawa et al. | 428/209 |
| 5,147,832 | 9/1992 | Shimoda et al. | 501/96 |

Primary Examiner—Mark L. Bell
Assistant Examiner—Michael A. Marcheschi
Attorney, Agent, or Firm—W. G. Fasse; D. H. Kane, Jr.

[57] ABSTRACT

A heat conductive aluminum nitride sintered body contains 100 parts by weight of aluminum nitride, at least 0.005 parts by weight and not more than 0.5 parts by weight of carbon, at least 0.01 parts by weight and not more than 15 parts by weight of a rare earth aluminum oxide in terms of the simple substance of a rare earth element, and at least 0.01 parts by weight and not more than 15 parts by weight of at least one element selected from a group of compounds containing elements belonging to the groups IVB, VB and VIB of the periodic table in terms of the simple substance of the element. Such a sintered body has a heat conductivity of at least 100 W/m·K and not more than 270 W/m·K at room temperature.

1 Claim, No Drawings

HEAT CONDUCTIVE COLORED ALUMINUM NITRIDE SINTERED BODY

CROSS-REFERENCE TO RELATED APPLICATION

The present application relates to U.S. Ser. No.: 07/738,461, filed on Jul. 31, 1991, by Inventors: Kouhei Shimoda, Takeo Maeda, Kouichi Sogabe, and Masaya Miyake; and entitled: "THERMAL CONDUCTIVE COLORED ALUMINUM NITRIDE SINTERED BODY AND METHOD OF PREPARING THE SAME", my Docket No.: 2647, now allowed.

FIELD OF THE INVENTION

The present invention relates to a ceramic sintered body which is employed as an electronic material such as an IC substrate material, a package material or the like, and more particularly, it relates to a colored aluminum nitride sintered body having a high heat conductivity. A method of preparing such a body is also disclosed.

BACKGROUND INFORMATION

In recent years, the technique relating to a large-scale integrated circuit device (LSI) has made a remarkable improvement in the degree of integration. Following such improvement in the degree of integration and due to an increase in size of an IC chip, the heat value generated in a package carrying such an IC chip, has also been increased. Accordingly, the heat radiation property of a substrate material employed for a package for a semiconductor device etc. has been regarded as important. The heat conductivity of an alumina sintered body, which has generally been widely used for making IC substrates, is rather insufficient to provide the required heat radiation property. Thus, it is difficult for the alumina sintered body to cope with the increased heat value of the IC chip. To this end, a study has been made to see whether beryllia can be substituted for alumina, since beryllia has a high heat conductivity. However, beryllia is hard to handle because of its toxicity.

On the other hand, a sintered body of aluminum nitride (AlN), which has a high heat conductivity and high insulation ability with no toxicity, is considered with interest as a material for a circuit substrate or a package for a semiconductor device.

In general, an impurity content of such an AlN sintered body is so reduced that an AlN sintered body with an excellent in heat conductivity and electrical insulation ability. Such a sintered body also has an excellent translucence, and hence the same is preferably used for making optical filters etc. in practice. However, it is problematic to use the AlN sintered body for making a package etc. since the transmission of ultraviolet rays leads to malfunction of the IC.

To this end, colored AlN sintered bodies have been studied and several successful examples have been reported.

For example, Japanese Patent Laying-Open No. 63-233079 discloses a black aluminum nitride sintered body and a method of preparing the same. According to this literature, a black AlN sintered body can be obtained by adding a specific amount of calcium tungstate powder and/or calcium molybdate powder to AlN powder, mixing and molding the same, and thereafter firing the mixture in a non-oxidizing atmosphere.

On the other hand, Japanese Patent Laying-Open No. 63-310772 describes that a black AlN sintered body can be obtained by sintering AlN powder with metal molybdenum or a molybdenum compound, serving as an additive. However, the aluminum nitride sintered bodies disclosed in the aforementioned two gazettes have a low heat conductivity values of about 100 W/m·K.

AlN easily incorporates an impurity such as oxygen. Thus, AlN powder of high purity is generally employed in order to improve the heat conductivity. If the aforementioned substance is added for coloring, the heat or thermal conductivity may be reduced. Thus, it has been impossible to obtain a colored AlN sintered body having a high heat conductivity.

However, a substrate material for carrying an IC chip having a high output, must have a high heat conductivity, so that its heat radiation property is improved in order to prevent the IC from malfunctioning caused by a temperature rise of the IC chip. At the same time, the substrate must be colored in order to prevent the IC from a malfunction caused by the transmission of ultraviolet rays. According to the conventional technique, however, it has been difficult to provide a ceramic substrate, which can simultaneously satisfy the two requirements for the substrate material for an IC chip, as hereinabove described.

SUMMARY OF THE INVENTION

It is an object of the present invention to provide a colored aluminum nitride sintered body having an excellent heat conductivity in combination with a desirable opaqueness, which is useful as an electronic material such as an IC package material or a substrate material. Another object is to provide a method of preparing or producing an AlN sintered body.

In consideration of the aforementioned circumstances, the inventors have studied AlN sintered bodies in an effort to provide such bodies having two incompatible characteristics simultaneously, namely a high heat conductivity and a coloring property. The following two points have been found:

(a) The presence of carbon in the sintered body is effective for coloring of the sintered body.

(b) When the sintered body contains a rare earth aluminum oxide, which is a composite oxide of a rare earth oxide and an aluminum oxide, and a compound of an element belonging to the group IVB, VB or VIB of the periodic table in prescribed amounts, and has a specific amount of carbon, the sintered body is colored and has a high heat conductivity of at least 100 W/m·K and not more than 270 W/m·K at room temperature.

In a specific composition, the aluminum nitride sintered body of the invention contains 100 parts by weight of AlN, at least 0.005 parts by weight and not more than 0.5 parts by weight of carbon, at least 0.01 parts by weight and not more than 15 parts by weight of a rare earth aluminum oxide in terms of the simple substance of a rare earth element, and at least 0.01 parts by weight and not more than 15 parts by weight of at least one element selected from a group of compounds containing elements belonging to the groups IVB, VB and VIB of the periodic table in terms of the simple substance of the element. The elements belonging to the group IVB of the periodic table are Ti, Zr and Hf. The elements belonging to the group VB are V, Nb and Ta. The elements belonging to the group VIB are Cr, Mo and W.

The rare earth elements are selected from the group of Sc, Y, La, Ce, Pr, Nd, Sm, Eu, Gd, Tb, Dy, Ho, Er, Yb and Lu. The rare earth aluminum oxide is formed by chemical reaction between an additional rare earth element oxide and aluminum oxide which is present in AlN as an impurity, to be contained in the sintered body. Although the effect of the existence of aluminum oxide is not varied with the type of the rare earth element, it is preferable to add any one of Sc, Y, La and Ce in order to obtain a sintered body which is very reliable in its resistance against chemical attack etc.

The carbon content in the present aluminum nitride sintered body is restricted in a range of at least 0.005 parts by weight and not more than 0.5 parts by weight with respect to 100 parts by weight of aluminum nitride. If the carbon content is less than the lower limit of this range, it is impossible to obtain a sintered body having a high heat conductivity. If the carbon content exceeds the upper limit of the aforementioned range, on the other hand, the carbon deoxidizes a liquid phase of the rare earth aluminum oxide during firing thereby blocking mass transfer through such a liquid phase. Thus, it would be impossible to obtain a dense sintered body if the carbon content exceeds the upper limit.

In a method of producing a heat conductive colored aluminum nitride sintered body according to one aspect of the present invention, at least 0.01 parts by weight and not more than 5 parts by weight of carbon, at least 0.01 parts by weight and not more than 15 parts by weight of a rare earth element oxide in terms of the simple substance of the rare earth element, and at least 0.01 parts by weight and not more than 15 parts by weight of at least one element selected from a group of oxides, carbides and nitrides of elements belonging to the groups IVB, VB and VIB of the periodic table in terms of the simple substance of the element, are mixed with 100 parts by weight of aluminum nitride, to obtain a mixture. The mixture is shaped into a prescribed configuration, to obtain a compact. The compact is fired in a non-oxidizing atmosphere at a temperature of at least 1500° C. and not more than 2100° C.

The additional amount of carbon is synthetically determined while taking into the type of the additional carbon, the oxygen content in the AlN raw material powder, the firing conditions, and the like. At least 0.01 parts by weight and not more than 5 parts by weight of carbon is added to 100 parts by weight of aluminum nitride, for reasons similar to the above. The lower limit of the additional amount of carbon is set at 0.01 parts by weight, so that the finally obtained aluminum nitride sintered body contains at least 0.005 parts by weight of carbon.

The carbon material herein employed may be prepared of carbon black, coke, graphite powder, diamond powder or the like. It is preferable to restrict the particle diameter, the specific surface area, the pH value, the volatile components etc. of such carbon material to specific values, in order to attain a homogeneous dispersion in an the still unsintered body of aluminum nitride. In particular, it is effective to use fine powder of carbon black having a BET value of at least 200 m$^2$/g. The term "BET value" indicates one value of a specific surface area measured by an absorption process.

The compact is fired at a temperature of at least 1500° C. since the densification of the sintered body proceeds at a slow speed at temperatures lower than 1500° C. which is not economical. If the firing temperature exceeds 2100° C., on the other hand, it is difficult to obtain a dense sintered body since aluminum nitride is significantly decomposed and evaporated. The rare earth aluminum oxide is formed by reaction between the rare earth element oxide and the aluminum oxide. The grain growth of AlN progresses by mass transfer through a liquid phase of the rare earth aluminum oxide. Therefore, if the temperature for forming such a liquid phase, i.e., the melting point of the rare earth aluminum oxide, is in excess of 2100° C., it is difficult to obtain a dense sintered body due to the decomposition and evaporation of AlN.

The thermal or heat conductivity of the colored aluminum nitride sintered body is improved by the addition of carbon, perhaps by the following mechanism: If a compound of the element belonging to the group IVB, VB or VIB of the periodic table is added to the unsintered body and fired in accordance with the conventional method, the liquid phase of the rare earth aluminum oxide has an inferior wettability with respect to aluminum nitride particles. Further, the compound of the element belonging to the group IVB, VB or VIB of the periodic table, which has an inferior wettability with respect to the AlN particles, remains in a grain boundary portion of the sintered body, thereby contributing to the coloring of the sintered body. At the same time, part of the compound solidly dissolves in the AlN particles with oxygen. If the element compound solidly dissolves in the AlN particles with oxygen, and the AlN particles have an inferior wettability with respect to the liquid phase of the rare earth aluminum oxide, it is difficult to trap oxygen from the AlN particles into the liquid phase of the rare earth aluminum oxide. It is known that oxygen untrapped by the liquid phase solidly dissolves in particles of the AlN sintered body, to form an oxynitride of $Al(Al_{(8/3+x/3)}O_{4-x}N_x)$, spinel ($Al_9O_3N_7$), $\alpha$-$Al_2O_3$ etc., whereby the heat conductivity of the sintered body is significantly reduced, regardless of its denseness.

On the other hand, the inventors have found that carbon added to the raw material reduces oxygen, which solidly dissolves in the AlN particles simultaneously with part of the compound of the element belonging to the group IVB, VB or VIB of the periodic table that also solidly dissolve in the AlN particles, and eliminates the same from the system. It is amazing that the wetting ability of the liquid phase is not reduced with respect to the AlN particles, in which the compound of the element belonging to the group IVB, VB or VIB of the periodic table solidly dissolves, but oxygen is sufficiently trapped from the AlN particles, whereby it is possible to obtain a sintered body having a high heat conductivity. At the same time, the carbon contained in the sintered body scatters visible rays which are transmitted through the sintered body, to effectively color the sintered body. It is believed to be possible that a colored sintered body having high heat conductivity can be obtained since the effect of the coloring is not lost by the addition of the compound of the element belonging to the group IVB, VB or VIB of the periodic table.

As to the compound of the element belonging to the group IVB, VB or VIB of the periodic table, a compound that converts to the aforementioned compound upon firing, e.g. an inorganic compound e.g. a nitrate or an oxalate of an element belonging to the group IVB, VB or VIB of the periodic table, or an organometallic compound e.g. an alkoxide may be employed in place of an oxide, a carbide or a nitride, to attain a similar effect. The effect of coloring is improved if the particle diameter of such a compound is reduced, preferably to about 0.05 to 1 μm. The upper limit of the particle diameter of the compound is about 20 times that of the AlN powder as used.

In a method of producing a heat conductive, colored aluminum nitride sintered body according to another aspect of the present invention, at least 0.01 parts by weight and not more than 5 parts by weight of a compound liberating carbon in terms of the amount of free carbon, at least 0.01 parts by weight and not more than 15 parts by weight of a rare earth element oxide in terms of the simple substance of the rare earth element, and at least 0.01 parts by weight and not more 15 parts by weight of at least one element selected from a group of oxides, carbides and nitrides of elements belonging to the groups IVB, VB and VIB of the periodic table in terms of the simple substance of the element, are mixed with 100 parts by weight of aluminum nitride, to obtain a mixture, which is shaped into a prescribed configuration to obtain a compact. The compact is heated in a nonoxidizing atmosphere under a temperature of at least 150° C. and not more than 1500° C. to liberate carbon. Thereafter the compact is fired in a non-oxidizing atmosphere at a temperature of at least 1500° C. and not more than 2100° C.

The compound liberating carbon may be selected from a group including an organic compound such as a fatty acid compound or an aromatic compound, or a high molecular compound such as styrene resin, acrylic resin, phenol resin or urethane resin. According to the present invention, it is preferable to use one of polyacrylonitrile, polyvinyl alcohol, polyvinyl butyral, polyethylene terephthalate, glucose, fructose and sucrose, or a mixture thereof.

The feature of the method according to the second aspect of the present invention, resides in that the compound liberating carbon is contained in the unsintered body, while carbon is contained in the unsintered body in the aforementioned method according to the first aspect of the present invention. According to this method, it is possible to homogeneously distribute carbon in the as-formed sintered body and to reduce any nonuniformity of the composition, the color tone etc. of the sintered body by appropriately selecting the compound for liberating carbon, which is homogeneously dispersed in the unsintered body.

In a method of preparing a heat conductive colored aluminum nitride sintered body according to still another aspect of the present invention, at least 0.01 parts by weight and not more than 15 parts by weight of a rare earth element oxide in terms of the simple substance of the rare earth element, and at least one element selected from a group of oxides, carbides and nitrides of elements belonging to the groups IVB, VB and VIB of the periodic table in terms of the simple substance of the element are mixed with 100 parts by weight of aluminum nitride, to obtain a mixture which is shaped into a a desired configuration, to obtain a compact. The compact is fired in a non-oxidizing atmosphere containing at least 10 volume percent and not more than 100 volume percent of hydrocarbon gas at a temperature of at least 1500° C. and not more than 2100° C.

The hydrocarbon gas is introduced in order to eliminate oxygen from the system by chemical reaction. Therefore, any gas can be effectively employed so far as the same contains carbon. According to the present invention, however, it is preferable to use any one of methane gas, ethylene gas, acetylene gas, propane gas and butane gas.

In the aforementioned method according to the first or second aspect of the present invention, the mixture is shaped into a compact and carbon or a compound liberating carbon is added to the compact, thereby eliminating oxygen, from the system by solid phase reaction with the carbon following part of the compound of the element belonging to the group IVB, VB or VIB of the periodic table solidly dissolving in the AlN particles. On the other hand, the feature of the method according to the third aspect of the present invention resides in that oxygen, following part of the element belonging to the group IVB, VB or VIB of the periodic table solidly dissolving in the AlN particles, is eliminated from the system by gas phase reaction with the hydrocarbon gas. The hydrocarbon gas, which has a higher reactivity than carbon or carbon liberated from the compound, efficiently reduces oxygen following the part of the compound of the element belonging to the group IVB, VB or VIB of the periodic table, solidly dissolving in the AlN particles in a short time, to eliminate the same from the system. Therefore, it is possible to obtain a colored aluminum nitride sintered body having a simultaneously high heat conductivity even if a relatively short duration firing is employed. In the method according to the first or second aspect of the present invention, an unevenness may be caused in the composition, in the color tone etc. of the sintered body, depending on the dispersed state of carbon or the compound liberating carbon. However, such unevenness is hardly caused in the method according to the third aspect of the present invention.

The rare earth element oxide is added in an amount of at least 0.01 parts by weight and not more than 15 parts by weight in terms of the simple substance of the rare earth element, so that the as-formed aluminum nitride sintered body contains a rare earth aluminum nitride in the same range in terms of the simple substance of the rare earth element, for the following reason: If the amount is smaller than the lower limit of the above range, the absolute amount of the liquid phase of the rare earth aluminum oxide, being a composite oxide, is so insufficient that a dense sintered body cannot be obtained. If the amount exceeds the upper limit of the above range, on the other hand, an excess liquid phase exudes on the surface of the sintered body, to destabilize the color tone of the as-formed sintered body with spotting etc.

At least one element selected from the group of oxides, carbides and nitrides of the elements belonging to the groups IVB, VB and VIB of the periodic table, is added in an amount of at least 0.01 parts by weight and not more than 15 parts by weight in terms of the simple substance of the rare earth element so that the as-formed aluminum nitride sintered body includes a compound containing the element in the same range, for the following reason: If the amount is smaller than the lower limit of the aforementioned range, the as-formed sintered body is insufficiently colored. If the amount exceeds the upper limit of the aforementioned range, on the other hand, it is impossible to obtain a dense sintered body since the compound of the element dissolves in the liquid phase of the rare earth aluminum oxide, being a composite oxide, to significantly block its wettability with respect to the AlN particles.

While the effect according to the present invention can be sufficiently attained by simply adding the aforementioned components to aluminum nitride, it is also possible to employ a well-known binder such as acrylic resin for example PVA, PVB or PMMA, paraffin or the like, in order to improve the compactibility of the unsintered body. Further, 50 parts by weight of hexagonal BN may be contained in 100 parts by weight of AlN at the maximum, in order to improve various characteristics such as the machinability.

In the method of preparing an aluminum nitride sintered body according to the present invention, the step of molding the mixture of a prescribed composition, may be carried out by any method such as a doctor blade coater, press molding, CIP (cold isostatic pressing) or the like.

The as-formed heat conductive, colored aluminum nitride sintered body of the invention satisfies the the non-compatible requirements for a high heat conductivity and a coloring property. When an IC chip is carried on a substrate made of the present aluminum nitride sintered body, it is possible to suppress the temperature rise caused by heat generated by the IC chip to avoid the transmission of ultraviolet rays from the exterior. Consequently, it is possible to reduce malfunctions of the IC chip. The substrate may be in any one of a number of generally known forms such as DIP (dual in-line package), CERDIP (ceramic dual in-line package), LCC (leadless chip carrier), a flat package, PGA (pin grid array), a cerquad package, a hybrid package, a mother board and the like. The characteristics of the substrate, i.e., heat conductivity and coloring property, do not deteriorate in any of these forms. The present aluminum nitride sintered body, which is employed as a substrate material in any one of the aforementioned forms, generally comprises a conductor layer of tungsten etc., a sealing layer of glass etc., or a thin film circuit. An effect of such a conductor layer, sealing layer or thin film circuit will not be damaged in a substrate made of the present aluminum nitride sintered body.

According to the present invention, as hereinabove described, it is possible to obtain a colored aluminum nitride sintered body having an excellent heat conductivity and coloring.

DESCRIPTION OF THE PREFERRED EMBODIMENTS

Example 1

1 part by weight of carbon black having a BET value of 500 m$^2$/g, 1 part by weight of yttrium oxide in terms of the simple substance of yttrium, and 1 part by weight of titanium oxide in terms of the simple substance of titanium were mixed with 100 parts by weight of AlN powder having a mean particle diameter of 1 μm. A binder, a plasticizer, a deflocculant, a solvent, a wetting agent and an antielectrostatic agent were also added to the powder, and mixed in a ball mill. The plasticizer was prepared of a mixture of dibutyl phthalate (DBP) and benzyl butyl phthalate (BBP). The deflocculant was prepared of menhaden fish oil. The solvent was prepared of a mixture of trichloroethylene, ethyl alcohol and methyethylketone. The wetting agent was glycerine monooleate. The as-formed slurry was defoamed, to prepare a green sheet of AlN by a doctor blade coater.

This green sheet was fired in a nitrogen atmosphere at a temperature of 1800° C. for 3 hours, to obtain a black sintered body.

The heat conductivity, measured by a laser flash method, of this sintered body was 150 W/m·K at room temperature.

This sintered body contained carbon, yttrium and titanium respectively in amounts of 0.03 parts by weight, 0.93 parts by weight and 0.85 parts by weight with respect to 100 parts by weight of AlN. A sample No. 1 shown in Tables 1 and 2 was formed of this aluminum nitride sintered body.

In a similar manner to the above, elements were blended in accordance with compositions shown in Table 1 to produce compacts by a doctor blade coater. The compacts were fired at temperatures in a range of 1500° to 2100° C. Table 2 shows color tones, heat conductivity values and the contents of carbon, yttrium and elements of additives belonging to the groups IVB, VB and VIB of the periodic table, of the as-formed sintered bodies.

Comparative Example 1

The elements were blended in accordance with compositions shown in Table 3 to produce compacts by a doctor blade coater in a similar manner to Example 1, and then the compacts were fired at temperatures in a range of 1500° to 2100° C.

Table 4 shows color tones, heat conductivity values and contents of carbon, yttrium and elements additives belonging to the groups IVB, VB and VIB of the periodic table, of the as-formed sintered bodies.

Example 2

A prescribed amount of polyvinyl alcohol, serving as a compound for liberating carbon, 1 part by weight of yttrium oxide in terms of the simple substance of yttrium, and 1 part by weight of titanium oxide in terms of the simple substance of titanium were added to 100 parts by weight of AlN powder having a mean particle diameter of 1 μm. A binder, a plasticizer, a solvent and a wetting agent were mixed with said powder in a ball mill. The binder was made of a mixture of ethylene vinyl acetate (EVA) and polypropylene (PP). The plasticizer was made of a mixture of dibutyl phthalate (DBP) and benzyl butyl phthalate (BBP). A solvent of butyl alcohol was added to form a slurry which was granulated by spray drying to form a granular material which was press-molded under a pressure of 1 ton/cm$^2$ to form a compact.

The as-formed compact was heat treated in a nitrogen atmosphere at a temperature of 1000° C. for 10 hours, to liberate carbon. The amount of free carbon was 0.88 parts by weight with respect to 100 parts by weight of AlN. Thereafter the compact was fired in a nitrogen atmosphere at a temperature of 2000° C. for 5 hours, to obtain a black sintered body.

The heat conductivity at room temperature and the contents of carbon, yttrium and titanium of the as formed sintered body were measured. As a result, the sintered body had a heat conductivity of 170 W/m·K and contents of carbon, yttrium and titanium were 0.01 parts by weight, 0.85 parts by weight and 0.88 parts by weight respectively, in 100 parts by weight of AlN. A sample No. 31 shown in Tables 5, 6 and 7 was formed of this aluminum nitride sintered body.

In a similar manner to the above, the elements were blended in accordance with compositions shown in Table 5, to make compacts by press molding. The compacts were heat treated under the conditions shown in Table 6, to liberate carbon. Table 6 shows the carbon contents after the heat treatment, with respect to 100 parts by weight of AlN. The heat treated compacts were fired at temperatures in a range of 1500° to 2100° C.

Table 7 shows color tones, heat conductivity values and the contents of carbon, yttrium and elements additives belonging to the groups IVB, VB and VIB of the periodic table, of the as-formed sintered bodies.

Example 3

1 part by weight of yttrium oxide in terms of the simple substance of yttrium and 1 part by weight of titanium oxide in terms of the simple substance of titanium were added to 100 parts by weight of AlN powder having a mean particle diameter of 1 μm. Octadiene was added to this powder as a defocculant and then mixed with the powder in methylisobutylketone in a ball mill to form a slurry. The as-formed slurry was dried at a temperature of 230° C., to prepare a compact by a CIP method. The compact was fired in a non-oxidizing atmosphere containing 30 volume percent of butane gas and the rest was ammonia gas, at a temperature of 1800° C. for one hour, whereby a black sintered body was obtained.

The as-formed sintered black body was measured to ascertain its heat conductivity at room temperature and its contents of carbon, yttrium and titanium, similarly to Example 1. The sintered body had a heat conductivity of 150 W/m·K and contents of carbon, yttrium and titanium were 0.01 parts by weight, 0.94 parts by weight and 0.97 parts by weight respectively in 100 parts by weight of AlN. A sample No. 55 shown in Tables 8, 9 and 10 was formed of this aluminum nitride sintered body.

In a similar manner to the above, elements were blended in accordance with compositions shown in Table 8, to form compacts by a CIP method. The compacts were fired in non-oxidizing atmospheres having the compositions shown in Table 9 at temperatures in a range of 1500° to 2100° C.

Table 10 shows color tones, heat conductivity values and contents of carbon, yttrium and elements of additives belonging to the groups IVB, VB and VIB of the periodic table, of the as-formed sintered bodies.

Example 4

20 parts by weight of hexagonal BN, 1 part by weight of carbon black having a BET value of 250 m²/g, 1 part by weight of scandium oxide in terms of the simple substance of scandium, and 1 part by weight of titanium oxide in terms of the simple substance of titanium were added to 100 parts by weight of AlN powder having a mean particle diameter of 1 μm. A binder, a plasticizer, a solvent and a wetting agent were also added to the powder and mixed in a ball mill. The binder was a mixture of ethylene vinyl acetate (EVA) and polypropylene (PP). The plasticizer was a mixture of dibutyl phthalate (DBP) and benzyl butyl phthalate (BBP). The solvent was butyl alcohol. The as-formed slurry was granulated by spray drying, and press-molded under a pressure of 1 ton/cm² to form a compact. The as-formed compact was fired in a nitrogen atmosphere at a temperature of 1900° C. for 2 hours, whereby a black sintered body was obtained.

The as-formed sintered body was measured to ascertain its heat conductivity at room temperature and its contents of carbon, scandium and titanium, similarly to Example 1. The sintered body had a heat conductivity of 130 W/m·K and the contents of carbon, scandium and titanium were 0.02 parts by weight, 0.88 parts by weight, and 0.81 parts by weight respectively, in 100 parts by weight of AlN. A sample No. 79 shown in Tables 11 and 12 was formed of this aluminum nitride sintered body.

In a similar manner, titanium oxide having rutile-type crystals was used as a compound containing an element belonging to the group IVB, VB or VIB of the periodic table and blended in accordance with compositions shown in Table 11, to produce compacts by press molding. The compacts were fired at temperatures in a range of 1500° to 2100° C.

Table 12 shows color tones, heat conductivity values and contents of carbon, rare earth elements and titanium of the as-formed sintered bodies.

Example 5

Tungsten oxide was used as a compound containing an element belonging to the group IVB, VB or VIB of the periodic table and blended in accordance with compositions shown in Table 13, to make compacts by a doctor blade coater, similarly to Example 1. The compacts were fired at temperatures in a range of 1500° to 2100° C.

Table 14 shows color tones, heat conductivity values and contents of carbon, rare earth elements, and tungsten of the as-formed sintered bodies.

Comparative Example 2

Tungsten oxide was used as a compound containing an element belonging to the group IVB, VB or VIB of the periodic table and blended in accordance with compositions shown in Table 15, to make compacts by a doctor blade coater similarly to Example 1. The compacts were fired at temperatures in a range of 1500° to 2100° C.

Table 16 shows color tones, heat conductivity values and contents of carbon, rare earth elements, and tungsten of the as-formed sintered bodies.

Comparing the heat conductivity values and the color tones of the samples obtained according to the aforementioned, Examples and comparative examples, the samples of the invention exhibited heat conductivity values of at least 100 W/m·K with colors of gray or black. On the other hand, black comparative samples exhibited heat conductivity values of less than 100 W/m·K, while those exhibiting heat conductivity values exceeding 100 W/m·K were merely colored in white or spotted.

TABLE 1

| Invention Sample No. | Additional Amount of Carbon (wt. part) | Additional Amount of Yttrium (wt. part) | Additional Amount of Additive (wt. part) | Additional Compound |
|---|---|---|---|---|
| 1 | 1.00 | 1.00 | 1.00 | $TiO_2$ |
| 2 | 0.01 | 1.00 | 1.00 | $TiO_2$ |
| 3 | 0.50 | 0.01 | 1.00 | $ZrO_2$ |
| 4 | 1.00 | 1.00 | 0.01 | $ZrO_2$ |
| 5 | 3.00 | 1.00 | 1.00 | $HfO_2$ |
| 6 | 5.00 | 1.00 | 1.00 | $V_2O_5$ |
| 7 | 1.00 | 3.00 | 1.00 | $Nb_2O_5$ |
| 8 | 1.00 | 5.00 | 1.00 | $Ta_2O_5$ |
| 9 | 1.00 | 10.00 | 1.00 | $Cr_2O_3$ |
| 10 | 1.00 | 15.00 | 1.00 | $CrO_3$ |

TABLE 1-continued

| Invention Sample No. | Additional Amount of Carbon (wt. part) | Additional Amount of Yttrium (wt. part) | Additional Amount of Additive (wt. part) | Additional Compound |
|---|---|---|---|---|
| 11 | 1.00 | 1.00 | 3.00 | MoO₃ |
| 12 | 1.00 | 1.00 | 5.00 | WO₃ |
| 13 | 1.00 | 1.00 | 10.00 | WO₃ |
| 14 | 1.00 | 1.00 | 15.00 | WO₃ |
| 15 | 3.00 | 3.00 | 3.00 | TiN |
| 16 | 3.00 | 7.50 | 3.00 | TiC |
| 17 | 3.00 | 3.00 | 7.50 | ZrO₂ |
| 18 | 1.00 | 5.00 | 10.00 | TiO₂ |
| 19 | 5.00 | 1.00 | 10.00 | TiO₂ |
| 20 | 1.00 | 10.00 | 5.00 | TiO₂ |
| 21 | 0.50 | 0.50 | 0.50 | WO₃ |
| 22 | 1.00 | 0.50 | 0.50 | WO₃ |
| 23 | 0.50 | 1.00 | 0.50 | WO₃ |
| 24 | 0.50 | 0.50 | 1.00 | WO₃ |

TABLE 2

| Invention Sample No. | Color Tone | Heat conductivity W/m·K | Carbon Content (wt. part) | Yttrium Content (wt. part) | Additive Content (wt. part) |
|---|---|---|---|---|---|
| 1 | Black | 150 | 0.03 | 0.93 | 0.85 |
| 2 | Black | 110 | 0.005 | 0.88 | 0.81 |
| 3 | Black | 100 | 0.008 | 0.01 | 0.98 |
| 4 | Gray | 180 | 0.05 | 0.95 | 0.01 |
| 5 | Black | 230 | 0.10 | 0.99 | 0.85 |
| 6 | Black | 270 | 0.48 | 0.85 | 0.78 |
| 7 | Black | 190 | 0.04 | 2.73 | 0.87 |
| 8 | Gray | 250 | 0.05 | 4.58 | 3.94 |
| 9 | Black | 220 | 0.07 | 9.11 | 0.79 |
| 10 | Gray | 140 | 0.03 | 14.15 | 0.85 |
| 11 | Black | 130 | 0.06 | 0.90 | 2.38 |
| 12 | Black | 120 | 0.05 | 0.88 | 4.13 |
| 13 | Black | 110 | 0.02 | 0.83 | 8.85 |
| 14 | Black | 100 | 0.03 | 0.92 | 13.23 |
| 15 | Gray | 200 | 0.11 | 2.85 | 2.40 |
| 16 | Brown | 140 | 0.13 | 7.20 | 2.31 |
| 17 | Black | 150 | 0.12 | 2.57 | 6.72 |
| 18 | Black | 170 | 0.05 | 4.52 | 9.26 |
| 19 | Black | 210 | 0.37 | 0.82 | 8.98 |
| 20 | Black | 200 | 0.06 | 8.79 | 4.30 |
| 21 | Black | 150 | 0.01 | 0.43 | 0.38 |
| 22 | Black | 190 | 0.04 | 0.40 | 0.41 |
| 23 | Black | 180 | 0.02 | 0.85 | 0.37 |
| 24 | Black | 120 | 0.02 | 0.45 | 0.78 |

TABLE 3

| Comparative Sample No. | Additional Amount of Carbon (wt. part) | Additional Amount of Yttrium (wt. part) | Additional Amount of Additive (wt. part) | Additional Compound |
|---|---|---|---|---|
| 25 | 0.00 | 1.00 | 1.00 | TiO₂ |
| 26 | 1.00 | 0.00 | 1.00 | ZrO₂ |
| 27 | 1.00 | 1.00 | 0.00 | HfO₂ |
| 28 | 6.00 | 1.00 | 1.00 | V₂O₅ |
| 29 | 1.00 | 20.00 | 1.00 | MoO₂ |
| 30 | 1.00 | 1.00 | 20.00 | WO₃ |

TABLE 4

| Comparative Sample No. | Color Tone | Heat Conductivity W/m·K | Carbon Content (wt. part) | Yttrium Content (wt. part) | Additive Content (wt. part) |
|---|---|---|---|---|---|
| 25 | Black | 60 | 0.002 | 0.93 | 0.88 |
| 26 | White | 50 | 0.03 | 0.00 | 0.83 |
| 27 | White | 170 | 0.05 | 0.85 | 0.00 |
| 28 | Whitened | not densified | 0.72 | 0.82 | 0.90 |
| 29 | Spotted | 120 | 0.06 | 16.32 | 0.71 |
| 30 | Whitened | not densified | 0.04 | 0.87 | 15.55 |

TABLE 5

| Invention Sample No. | Additional Compound (Liberating Carbon) | Additional Amount of Yttrium (wt. part) | Additional Amount of Additive (wt. part) | Additional Compound |
|---|---|---|---|---|
| 31 | polyvinyl alcohol | 1.00 | 1.00 | TiO₂ |
| 32 | polyvinyl alcohol | 1.00 | 1.00 | ZrO₂ |
| 33 | polyvinyl butyral | 0.01 | 1.00 | WO₃ |
| 34 | polyethylene terephthalate | 1.00 | 0.01 | WO₃ |
| 35 | glucose | 1.00 | 1.00 | MoO₃ |
| 36 | fructose | 1.00 | 1.00 | Cr₂O₃ |
| 37 | sucrose | 3.00 | 1.00 | Ta₂O₅ |
| 38 | polyvinyl alcohol | 5.00 | 1.00 | Nb₂O₅ |
| 39 | polyvinyl butyral | 10.00 | 1.00 | V₂O₅ |
| 40 | sucrose | 15.00 | 1.00 | HfO₂ |
| 41 | polyacrylonitrile | 1.00 | 3.00 | ZrO₂ |
| 42 | polyvinyl alcohol | 1.00 | 5.00 | TiO₂ |
| 43 | polyethylene terephtalate | 1.00 | 10.00 | TiN |
| 44 | polyvinyl butyral | 1.00 | 15.00 | TiC |
| 45 | fructose | 3.00 | 3.00 | WC |
| 46 | glucose | 7.50 | 3.00 | WC |
| 47 | polyvinyl butyral | 3.00 | 7.50 | W₂C |
| 48 | sucrose | 5.00 | 10.00 | WO₃ |
| 49 | polyvinyl alcohol | 1.00 | 10.00 | WO₃ |
| 50 | polyacrylonitrile | 10.00 | 5.00 | WO₃ |
| 51 | glucose | 0.50 | 0.50 | TiO₂ |
| 52 | polyethylene terephthalate | 0.50 | 0.50 | TiO₂ |
| 53 | sucrose | 1.00 | 0.50 | ZrO₂ |
| 54 | polyvinyl butyral | 0.50 | 1.00 | ZrO₂ |

TABLE 6

| Invention Sample No. | Heat Treatment Temperature (°C) | Heat Treatment Time (h.) | Carbon Content (wt. part) |
|---|---|---|---|
| 31 | 1000 | 10 | 0.88 |
| 32 | 500 | 2 | 0.01 |
| 33 | 150 | 10 | 0.50 |
| 34 | 1200 | 5 | 1.11 |
| 35 | 800 | 2 | 2.70 |
| 36 | 500 | 2 | 4.88 |
| 37 | 300 | 5 | 1.15 |
| 38 | 1500 | 2 | 0.91 |
| 39 | 1200 | 5 | 1.06 |
| 40 | 500 | 10 | 0.82 |
| 41 | 1000 | 2 | 1.27 |
| 42 | 300 | 5 | 0.96 |
| 43 | 800 | 2 | 1.00 |
| 44 | 150 | 5 | 1.35 |
| 45 | 1500 | 5 | 3.19 |
| 46 | 800 | 10 | 3.25 |
| 47 | 500 | 2 | 3.40 |
| 48 | 1200 | 5 | 0.98 |
| 49 | 1000 | 10 | 4.57 |
| 50 | 500 | 10 | 1.03 |
| 51 | 1500 | 5 | 0.52 |
| 52 | 1200 | 2 | 1.09 |
| 53 | 500 | 5 | 0.47 |
| 54 | 300 | 10 | 0.50 |

TABLE 7

| Invention Sample No. | Color Tone | Heat conductivity W/m · K | Carbon Content (wt. part) | Yttrium Content (wt. part) | Additive Content (wt. part) |
|---|---|---|---|---|---|
| 31 | Black | 170 | 0.01 | 0.85 | 0.88 |
| 32 | Black | 120 | 0.005 | 0.83 | 0.87 |
| 33 | Black | 100 | 0.01 | 0.01 | 0.81 |
| 34 | Gray | 180 | 0.06 | 0.88 | 0.01 |
| 35 | Black | 220 | 0.15 | 0.80 | 0.77 |
| 36 | Black | 260 | 0.43 | 0.75 | 0.78 |
| 37 | Black | 190 | 0.03 | 2.65 | 0.83 |
| 38 | Gray | 260 | 0.02 | 4.53 | 0.79 |
| 39 | Black | 240 | 0.04 | 9.22 | 0.84 |
| 40 | Black | 150 | 0.03 | 13.99 | 0.85 |
| 41 | Black | 130 | 0.05 | 0.91 | 2.56 |
| 42 | Black | 130 | 0.02 | 0.84 | 4.12 |
| 43 | Gray | 120 | 0.02 | 0.82 | 9.05 |
| 44 | Black | 100 | 0.01 | 0.86 | 13.78 |
| 45 | Black | 220 | 0.10 | 2.65 | 2.50 |
| 46 | Black | 180 | 0.13 | 7.11 | 2.56 |
| 47 | Black | 150 | 0.11 | 2.42 | 6.67 |
| 48 | Black | 170 | 0.03 | 4.59 | 9.22 |
| 49 | Black | 210 | 0.31 | 0.79 | 8.84 |
| 50 | Black | 200 | 0.03 | 3.81 | 4.38 |
| 51 | Black | 140 | 0.01 | 0.38 | 0.41 |
| 52 | Black | 170 | 0.03 | 0.40 | 0.36 |
| 53 | Black | 170 | 0.008 | 0.82 | 0.38 |
| 54 | Black | 120 | 0.01 | 0.40 | 0.86 |

TABLE 8

| Invention Sample No. | Additional Amount Of Yttrium (wt. part) | Additional Amount Of Additive (wt. part) | Additional Compound |
|---|---|---|---|
| 55 | 1.00 | 1.00 | TiO$_2$ |
| 56 | 1.00 | 1.00 | TiO$_2$ |
| 57 | 0.01 | 1.00 | TiO$_2$ |
| 58 | 1.00 | 0.01 | TiO$_2$ |
| 59 | 1.00 | 1.00 | ZrO$_2$ |
| 60 | 1.00 | 1.00 | HfO$_2$ |
| 61 | 3.00 | 1.00 | V$_2$O$_5$ |
| 62 | 5.00 | 1.00 | V$_2$O$_3$ |
| 63 | 10.00 | 1.00 | Nb$_2$O$_5$ |
| 64 | 15.00 | 1.00 | Ta$_2$O$_5$ |
| 65 | 1.00 | 3.00 | Cr$_2$O$_3$ |
| 66 | 1.00 | 5.00 | MoO$_3$ |
| 67 | 1.00 | 10.00 | WO$_3$ |
| 68 | 1.00 | 15.00 | WO$_3$ |
| 69 | 3.00 | 3.00 | MoO$_3$ |
| 70 | 7.50 | 3.00 | MoO$_3$ |
| 71 | 3.00 | 7.50 | MoO$_3$ |
| 72 | 5.00 | 10.00 | ZrO$_2$ |
| 73 | 1.00 | 10.00 | ZrO$_2$ |
| 74 | 10.00 | 5.00 | ZrO$_2$ |
| 75 | 0.50 | 0.50 | TiN |
| 76 | 0.50 | 0.50 | TiN |
| 77 | 1.00 | 0.50 | TiN |
| 78 | 0.50 | 1.00 | TiN |

TABLE 9

| Invention Sample No. | Hydrocarbon Gas (vol. %) | Gas Type | Rest Gas |
|---|---|---|---|
| 55 | 30.0 | Butane Gas | Ammonia Gas |
| 56 | 20.0 | Propane Gas | Nitrogen Gas |
| 57 | 25.0 | Propane Gas | Nitrogen Gas |
| 58 | 30.0 | Propane Gas | Nitrogen Gas |
| 59 | 60.0 | Propane Gas | Argon Gas |
| 60 | 100.0 | Propane Gas | — |
| 61 | 30.0 | Ethylene Gas | Argon Gas |
| 62 | 30.0 | Ethylene Gas | Nitrogen Gas |
| 63 | 30.0 | Ethylene Gas | Nitrogen Gas |
| 64 | 50.0 | Ethylene Gas | Ammonia Gas |
| 65 | 30.0 | Acetylene Gas | Nitrogen Gas |
| 66 | 30.0 | Acetylene Gas | Nitrogen Gas |
| 67 | 30.0 | Acetylene Gas | Nitrogen Gas |
| 68 | 30.0 | Acetylene Gas | Nitrogen Gas |
| 69 | 50.0 | Methane Gas | Nitrogen Gas |
| 70 | 50.0 | Methane Gas | Nitrogen Gas |
| 71 | 50.0 | Methane Gas | Nitrogen Gas |
| 72 | 30.0 | Butane Gas | Ammonia Gas |
| 73 | 100.0 | Butane Gas | — |
| 74 | 30.0 | Butane Gas | Nitrogen Gas |
| 75 | 20.0 | Methane Gas | Ammonia Gas |
| 76 | 30.0 | Methane Gas | Ammonia Gas |
| 77 | 20.0 | Methane Gas | Nitrogen Gas |
| 78 | 20.0 | Methane Gas | Nitrogen Gas |

TABLE 10

| Invention Sample No. | Color Tone | Heat conductivity (W/m · K) | Carbon Content (wt. part) | Yttrium Content (wt. part) | Additive Content (wt. part) |
|---|---|---|---|---|---|
| 55 | Black | 150 | 0.01 | 0.94 | 0.97 |
| 56 | Black | 120 | 0.007 | 0.89 | 0.92 |
| 57 | Black | 150 | 0.02 | 0.01 | 0.79 |
| 58 | Gray | 170 | 0.03 | 0.83 | 0.01 |
| 59 | Black | 200 | 0.11 | 0.78 | 0.91 |
| 60 | Black | 240 | 0.21 | 0.85 | 0.82 |
| 61 | Black | 160 | 0.07 | 2.69 | 0.80 |
| 62 | Gray | 190 | 0.03 | 4.65 | 0.91 |
| 63 | Black | 210 | 0.05 | 9.04 | 0.83 |
| 64 | Black | 190 | 0.04 | 13.86 | 0.84 |
| 65 | Black | 160 | 0.02 | 0.92 | 2.83 |
| 66 | Black | 140 | 0.01 | 0.87 | 4.61 |
| 67 | Black | 130 | 0.03 | 0.90 | 9.18 |
| 68 | Black | 110 | 0.02 | 0.79 | 13.94 |
| 69 | Black | 220 | 0.07 | 2.80 | 2.75 |
| 70 | Black | 210 | 0.09 | 7.12 | 2.39 |
| 71 | Black | 180 | 0.10 | 2.52 | 6.87 |
| 72 | Black | 180 | 0.03 | 4.35 | 9.09 |
| 73 | Black | 190 | 0.25 | 0.85 | 9.00 |
| 74 | Black | 190 | 0.05 | 8.66 | 4.16 |
| 75 | Black | 130 | 0.008 | 0.38 | 0.36 |
| 76 | Black | 160 | 0.01 | 0.37 | 0.41 |
| 77 | Black | 140 | 0.02 | 0.83 | 0.40 |
| 78 | Black | 100 | 0.01 | 0.40 | 0.85 |

TABLE 11

| Invention Sample No. | Additional Amount of Carbon (wt. part) | Additional Amount of Rare Earth Element (wt. part) | Additional Amount of TiO$_2$ (in terms of Ti) (wt. part) | Additional Rare Earth Element |
|---|---|---|---|---|
| 79 | 1.00 | 1.00 | 1.00 | Sc$_2$O$_3$ |
| 80 | 1.00 | 1.00 | 1.00 | Y$_2$O$_3$ |
| 81 | 1.00 | 1.00 | 1.00 | La$_2$O$_3$ |
| 82 | 1.00 | 1.00 | 1.00 | Ce$_2$O$_3$ |
| 83 | 3.00 | 3.00 | 3.00 | Sc$_2$O$_3$ |
| 84 | 3.00 | 3.00 | 3.00 | Y$_2$O$_3$ |
| 85 | 3.00 | 3.00 | 3.00 | La$_2$O$_3$ |
| 86 | 3.00 | 3.00 | 3.00 | Ce$_2$O$_3$ |
| 87 | 0.50 | 0.50 | 0.50 | Sc$_2$O$_3$ |
| 88 | 0.50 | 0.50 | 0.50 | Y$_2$O$_3$ |
| 89 | 0.50 | 0.50 | 0.50 | La$_2$O$_3$ |
| 90 | 0.50 | 0.50 | 0.50 | Ce$_2$O$_3$ |

TABLE 12

| Invention Sample No. | Color Tone | Heat Conductivity (W/m · k) | Carbon Content (wt. part) | Rare Earth Element Content (wt. part) | Ti Content (wt. part) |
|---|---|---|---|---|---|
| 79 | Black | 130 | 0.02 | 0.88 | 0.81 |
| 80 | Black | 150 | 0.03 | 0.93 | 0.85 |
| 81 | Black | 120 | 0.03 | 0.90 | 0.88 |
| 82 | Black | 130 | 0.04 | 0.85 | 0.86 |
| 83 | Black | 190 | 0.10 | 2.69 | 2.55 |
| 84 | Gray | 200 | 0.11 | 2.85 | 2.40 |

TABLE 12-continued

| Invention Sample No. | Color Tone | Heat Conductivity (W/m·k) | Carbon Content (wt. part) | Rare Earth Element Content (wt. part) | Ti Content (wt. part) |
|---|---|---|---|---|---|
| 85 | Black | 190 | 0.09 | 2.63 | 2.67 |
| 86 | Gray | 210 | 0.10 | 2.78 | 2.54 |
| 87 | Black | 110 | 0.008 | 0.41 | 0.39 |
| 88 | Black | 140 | 0.01 | 0.39 | 0.41 |
| 89 | Black | 150 | 0.02 | 0.40 | 0.38 |
| 90 | Black | 120 | 0.01 | 0.38 | 0.43 |

TABLE 13

| Invention Sample No. | Additional Amount of Carbon (wt. part) | Additional Amount of Rare Earth Element (wt. part) | Additional Amount of WO₃ (in terms of W) (wt. part) | Additional Rare Earth Element |
|---|---|---|---|---|
| 91 | 1.00 | 1.00 | 1.00 | $Sc_2O_3$ |
| 92 | 1.00 | 1.00 | 1.00 | $Y_2O_3$ |
| 93 | 1.00 | 1.00 | 1.00 | $La_2O_3$ |
| 94 | 1.00 | 1.00 | 1.00 | $Ce_2O_3$ |
| 95 | 3.00 | 3.00 | 3.00 | $Sc_2O_3$ |
| 96 | 3.00 | 3.00 | 3.00 | $Y_2O_3$ |
| 97 | 3.00 | 3.00 | 3.00 | $La_2O_3$ |
| 98 | 3.00 | 3.00 | 3.00 | $Ce_2O_3$ |
| 99 | 0.50 | 0.50 | 0.50 | $Sc_2O_3$ |
| 100 | 0.50 | 0.50 | 0.50 | $Y_2O_3$ |
| 101 | 0.50 | 0.50 | 0.50 | $La_2O_3$ |
| 102 | 0.50 | 0.50 | 0.50 | $Ce_2O_3$ |

TABLE 14

| Invention Sample No. | Color Tone | Heat Conductivity (W/m·k) | Carbon Content (wt. part) | Rare Earth Element Content (wt. part) | Ti Content (wt. part) |
|---|---|---|---|---|---|
| 91 | Black | 140 | 0.03 | 0.91 | 0.86 |
| 92 | Black | 170 | 0.02 | 0.89 | 0.81 |
| 93 | Black | 160 | 0.03 | 0.88 | 0.90 |
| 94 | Black | 130 | 0.03 | 0.90 | 0.91 |
| 95 | Black | 190 | 0.12 | 2.70 | 2.63 |
| 96 | Black | 210 | 0.10 | 2.75 | 2.58 |
| 97 | Black | 180 | 0.09 | 2.68 | 2.71 |
| 98 | Black | 210 | 0.10 | 2.78 | 2.54 |
| 99 | Black | 120 | 0.01 | 0.39 | 0.42 |
| 100 | Black | 150 | 0.02 | 0.40 | 0.38 |
| 101 | Black | 140 | 0.02 | 0.37 | 0.41 |
| 102 | Black | 140 | 0.01 | 0.38 | 0.40 |

TABLE 15

| Comparative Sample No. | Additional Amount of Carbon (wt. part) | Additional Amount of Rare Earth Element (wt. part) | Additional Amount of WO₃ (in terms of W) (wt. part) | Additional Rare Earth Element |
|---|---|---|---|---|
| 103 | 0.00 | 1.00 | 1.00 | $Sc_2O_3$ |
| 104 | 0.00 | 1.00 | 1.00 | $Y_2O_3$ |
| 105 | 0.00 | 1.00 | 1.00 | $La_2O_3$ |
| 106 | 0.00 | 1.00 | 1.00 | $Ce_2O_3$ |
| 107 | 1.00 | 20.00 | 1.00 | $Sc_2O_3$ |
| 108 | 1.00 | 20.00 | 1.00 | $Y_2O_3$ |
| 109 | 1.00 | 20.00 | 1.00 | $La_2O_3$ |
| 110 | 1.00 | 20.00 | 1.00 | $Ce_2O_3$ |
| 111 | 1.00 | 1.00 | 0.00 | $Sc_2O_3$ |
| 112 | 1.00 | 1.00 | 0.00 | $Y_2O_3$ |
| 113 | 1.00 | 1.00 | 0.00 | $La_2O_3$ |
| 114 | 1.00 | 1.00 | 0.00 | $Ce_2O_3$ |
| 115 | 1.00 | 1.00 | 20.00 | $Sc_2O_3$ |
| 116 | 1.00 | 1.00 | 20.00 | $Y_2O_3$ |
| 117 | 1.00 | 1.00 | 20.00 | $La_2O_3$ |
| 118 | 1.00 | 1.00 | 20.00 | $Ce_2O_3$ |

TABLE 16

| Invention Sample No. | Color Tone | Heat Conductivity (W/m·k) | Carbon Content (wt. part) | Rare Earth Element Content (wt. part) | W Content (wt. part) |
|---|---|---|---|---|---|
| 103 | Black | 50 | 0.002 | 0.92 | 0.87 |
| 104 | Black | 70 | 0.001 | 0.90 | 0.82 |
| 105 | Black | 60 | 0.002 | 0.89 | 0.88 |
| 106 | Black | 60 | 0.001 | 0.87 | 0.85 |
| 107 | Spotted in Gray | 130 | 0.03 | 17.01 | 0.82 |
| 108 | Spotted in White | 120 | 0.02 | 16.78 | 0.91 |
| 109 | Spotted in Yellow | 120 | 0.02 | 17.11 | 0.88 |
| 110 | Spotted in White | 100 | 0.04 | 16.86 | 0.89 |
| 111 | White | 160 | 0.05 | 0.85 | 0.00 |
| 112 | White | 160 | 0.03 | 0.92 | 0.00 |
| 113 | White | 150 | 0.03 | 0.87 | 0.00 |
| 114 | White | 140 | 0.04 | 0.86 | 0.00 |
| 115 | Whitened | not densified | 0.05 | 0.88 | 16.58 |
| 116 | Whitened | not densified | 0.04 | 0.87 | 15.55 |
| 117 | Whitened | not densified | 0.03 | 0.91 | 16.03 |
| 118 | Whitened | not densified | 0.04 | 0.89 | 15.94 |

Example 6

A green sheet having the same composition as the sample No. 1 was produced. A caking additive such as polyvinyl alcohol, polymethyl methacrylate or ethyl cellulose was mixed with a solvent such as butyl carbitol or α-terpineol, to prepare a vehicle. Thereafter tungsten powder of 2 μm in mean particle diameter was mixed with this vehicle in a weight ratio 100:20, to prepare a metallized paste. The as-formed metallized paste was applied onto the green sheet by screen printing, and the green sheet was subjected to sheet working and lamination. Then the green sheet coated with the metallized paste was fired in a nitrogen atmosphere at a temperature of 1800° C. for one hour. Nickel plating, brazing and gold plating were performed on the as-formed sintered body, to produce a flat package.

An IC chip having an output of 2 W was joined and packaged onto the flat package with gold silicon solder in the atmosphere at a temperature of 300° C. This IC chip was bonded by hot ultrasonic bonding using a gold wire, and operated. The temperature of the IC chip remained at 52° C., which was lower by 13° C. than that resulting from a test made on a similar green sheet having the same composition as the comparative sample No. 25.

It was recognized that insulability or insulation ability was rather excellent with an interwiring insulation resistance of $10^{14}$ Ω-cm. In order to measure the adhesion strength between a tungsten conductor layer formed by the aforementioned metallized paste and the heat conductive colored aluminum sintered body, a wire was soldered to a portion 1 mm square after gold plating and perpendicularly pulled with respect to the substrate. As a result, it was confirmed that the adhesion strength was at a practically nonproblematic value of 3.5 kg/mm².

Example 7

The sintered body of sample No. 1 was metallized with gold, and a lead frame of an iron-nickel-cobalt alloy was joined thereto with fusible glass, to form a ceramic quad flat package (QFP). An IC chip having an output of 2 W was secured on the as-formed package by a method similar to that in Example 6 and operated. The temperature of this IC chip remained at 56° C., which was lower by 21° C. than that resulting from a test made on a ceramic quad flat package similarly produced of the sintered body of the comparative sample No. 25.

It was recognized that insulability or insulation ability was remarkably improved with an interwiring insulation resistance of $10^{14}$ Ω-cm. It was also confirmed that the airtightness measured with a helium leak checker was at a practically nonproblematic level of $1 \times 10^{-8}$ atm-cc/sec.

Example 8

The sintered body of the sample No. 1 was metallized with gold, and a lead frame of an iron-nickel-cobalt alloy was joined thereto with fusible glass, to form a ceramic QFP. A copper wiring pattern was formed on a polyimide film, and an IC chip having an output of 2 W was secured thereon with a gold bump. This structure was joined and packaged onto the ceramic QFP with gold silicon solder in the temperature at a temperature of 300° C., and then the IC chip was operated. The temperature of the IC chip remained at 60° C., which was lower by 26° C. than that resulting from a test made on a ceramic QFP produced of a green sheet of the same composition as the comparative sample No. 25.

It was confirmed that the insulability or insulation ability was remarkable with an interwiring insulation resistance of $10^{14}$ Ω-cm. It was also confirmed that the airtightness measured with a helium leak checker was at a practically nonproblematic level of $1 \times 10^{-8}$ atm-cc/sec.

Example 9

A green sheet having the same composition as the sample No. 1 was formed. A caking additive such as polyvinyl alcohol, polymethyl methacrylate or ethyl cellulose was mixed with a solvent such as butyl carbitol or α-terpineol, to prepare a vehicle. Thereafter tungsten powder of 2 μm in mean particle diameter, was mixed with the vehicle in a weight ratio 10:20, to prepare a metallized paste. The as-formed metallized paste was applied onto the green sheet by screen printing and the green sheet was subjected to sheet working and lamination. The green sheet coated with the metallized paste was fired in a nitrogen atmosphere at a temperature of 1750° C. for 2 hours. Further, nickel plating, brazing and gold plating were performed on the as-formed sintered body, to prepare a pin grid array (PGA).

An IC chip having an output of 2 W was joined and packaged onto the as-formed package with gold silicon solder in the atmosphere at a temperature of 300° C. The IC chip was bonded by hot ultrasonic bonding with a gold wire and then operated. The temperature of the IC chip remained at 30° C., which was lower by 9° C. than that resulting from a test made on a flat package made of a green sheet having the same composition as the comparative sample No. 25.

It was confirmed that the insulability or insulation ability was remarkable with an interwiring insulation resistance of $10^{14}$ Ω-cm. In order to measure the adhesion strength between a tungsten conductor layer formed by the aforementioned metallized paste and the heat conductive aluminum nitride sintered body, a pin of an iron-nickel-cobalt alloy, which was joined to the substrate through the conductor layer, was perpendicularly pulled with respect to the substrate. As the result, it was confirmed that the adhesion strength was at a practically nonproblematic level of 3.7 kg/mm².

Example 10

A green sheet having the same composition as the sample No. 1 was formed. A caking additive such as polyvinyl alcohol, polymethyl methacrylate or ethyl cellulose was mixed with a solvent such as butyl carbitol or α-terpineol, to provide a vehicle. Thereafter tungsten powder of 2 μm in mean particle diameter was mixed with the vehicle in a weight ratio 100:20, to form metallized paste. The metallized paste was applied onto the green sheet by screen printing and the green sheet was subjected to sheet working and lamination. The green sheet coated with the metallized paste was fired in a nitrogen atmosphere at a temperature of 1850° C. for 3 hours. Further, nickel plating and gold plating were performed on the as-formed sintered body to form a leadless chip carrier (LCC).

An IC chip having an output of 2 W was joined and packaged onto this LCC with gold silicon solder, in the atmosphere at a temperature of 300° C. The IC chip was bonded by hot ultrasonic bonding with a gold wire, and then operated. The temperature of the IC chip remained at 33° C., which was lower by 12° C. than that resulting from a test made on a flat package made of a green sheet having the same composition as the comparative sample No. 25.

It was confirmed that the insulability or insulation ability was remarkable with an interwiring insulation resistance of $10^{14}$ Ω-cm. In order to measure the adhesion strength between a tungsten conductor layer formed by the metallized paste and the heat conductive colored aluminum nitride sintered body, gold plating was performed on the conductor layer and a wire was soldered to a portion 1 mm square and perpendicularly pulled with respect to the substrate. As the result, it was confirmed that the adhesion strength was at a practically nonproblematic level of 3.8 kg/mm².

According to the present invention, as hereinabove described, it is possible to obtain a colored aluminum nitride sintered body which has excellent heat conductivity. The inventive aluminum sintered body is usefully applied to an electronic material for an PC package, a substrate or the like, with a high industrial value.

What is claimed is:

1. A method of preparing a heat conductive colored aluminum nitride sintered body, comprising the steps of: mixing at least 0.01 parts by weight and not more than 15 parts by weight of an oxide of a rare earth element in terms of the simple substance of said rare earth element, and at least 0.01 parts by weight and not more than 15 parts by weight of at least one element selected from a group consisting of oxides, carbides and nitrides of elements belonging to the groups IVB, VB and VIB of the periodic table in terms of the simple substance of said element and 100 parts by weight of aluminum nitride, thereby obtaining a mixture; shaping said mixture into a compact; and firing said compact in a non-oxidizing atmosphere containing at least 10 volume percent and not more than 100 volume percent of hydrocarbon gas selected from the group consisting of methane gas, ethylene gas, acetylene gas, propane gas and butane gas under a temperature of at least 1500° C. and not more than 2100° C., said hydrocarbon gas eliminating oxygen by chemical reaction, whereby said aluminum nitride sintered body has a uniformly distributed dark color within the range of gray to black and simultaneously a thermal conductivity within the range of 100 W/m·K to 270 W/m·K.

* * * * *

UNITED STATES PATENT AND TRADEMARK OFFICE
CERTIFICATE OF CORRECTION

PATENT NO. : 5,294,388
DATED : March 15, 1994
INVENTOR(S) : Shimoda et al.

It is certified that error appears in the above-indentified patent and that said Letters Patent is hereby corrected as shown below:

```
Col. 6, line  8, delete ",";
        line  9, after "carbon" insert --,--;
Col. 7, line 24, after "chip" insert --and--.
Col. 8, line 30, after "elements" insert --of--.
Ccl. 17, line 22, replace "temperature" by --atmosphere--.
```

Signed and Sealed this

Seventh Day of November, 1995

Attest:

BRUCE LEHMAN

Attesting Officer    Commissioner of Patents and Trademarks